(12) United States Patent
van Haaster

(10) Patent No.: US 7,883,340 B2
(45) Date of Patent: Feb. 8, 2011

(54) ELECTROCOATED CONTACTS COMPATIBLE WITH SURFACE MOUNT TECHNOLOGY

(75) Inventor: Philip van Haaster, Corona, CA (US)

(73) Assignee: Laird Technologies, Inc., Chesterfield, MO (US)

( * ) Notice: Subject to any disclaimer, the term of this patent is extended or adjusted under 35 U.S.C. 154(b) by 0 days.

(21) Appl. No.: 12/627,891

(22) Filed: Nov. 30, 2009

(65) Prior Publication Data

US 2010/0167600 A1 Jul. 1, 2010

Related U.S. Application Data

(63) Continuation of application No. 12/349,484, filed on Jan. 6, 2009, now Pat. No. 7,625,218, which is a continuation of application No. 11/757,819, filed on Jun. 4, 2007, now Pat. No. 7,488,181.

(60) Provisional application No. 60/879,393, filed on Jan. 9, 2007.

(51) Int. Cl.
*H01R 12/00* (2006.01)
*H05K 1/00* (2006.01)

(52) U.S. Cl. ........................................ 439/66

(58) Field of Classification Search ................ 439/66, 439/95; 361/804, 758, 742
See application file for complete search history.

(56) References Cited

U.S. PATENT DOCUMENTS

| | | | |
|---|---|---|---|
| 5,068,493 A | 11/1991 | Benn, Sr. et al. | |
| 5,141,770 A | 8/1992 | Benn, Sr. et al. | |
| 5,297,008 A | 3/1994 | Estes | |
| 5,556,286 A | 9/1996 | Ikesugi et al. | |
| 5,748,449 A | 5/1998 | Tahmassebpur | |
| 6,255,581 B1 | 7/2001 | Reis et al. | |
| 6,893,952 B2 | 5/2005 | Jiang et al. | |
| 6,910,900 B2 | 6/2005 | Pan | |
| 6,986,670 B2 | 1/2006 | Okura et al. | |
| 6,992,544 B2 * | 1/2006 | Barnes et al. | ................ 333/33 |
| 7,129,421 B2 | 10/2006 | Reis et al. | |

(Continued)

FOREIGN PATENT DOCUMENTS

EP 0 396 248 A2 3/1990

(Continued)

OTHER PUBLICATIONS

Gore-Shield Supersoft SMT EMI Gaskets and Grounding Pads, 2 pages.

*Primary Examiner*—Javaid Nasri
(74) *Attorney, Agent, or Firm*—Harness, Dickey & Pierce, P.L.C.

(57) ABSTRACT

According to various aspects, exemplary embodiments are provided of contacts that may be compatible with surface mount technology. The contacts may be surface mountable for establishing an electrical pathway (e.g., electrical grounding contact, etc.) from at least one electrically-conductive surface on the substrate to another electrically-conductive surface (e.g., EMI shield, battery contact, etc.). In one exemplary embodiment, a contact generally includes a resilient dielectric core member. At least one outer electrically-conductive layer is electrocoated onto the resilient dielectric core member. A solderable electrically-conductive base member may be coupled to the resilient core member and/or the outer electrically-conductive layer. The base member may be in electrical contact with the outer electrically-conductive layer.

8 Claims, 37 Drawing Sheets

U.S. PATENT DOCUMENTS

| | | |
|---|---|---|
| 7,488,181 B2 | 2/2009 | van Haaster |
| 7,625,218 B2 | 12/2009 | van Haaster |
| 2002/0081869 A1* | 6/2002 | Abbott .................. 439/66 |
| 2003/0052755 A1 | 3/2003 | Barnes et al. |
| 2004/0216910 A1 | 11/2004 | Reis et al. |

FOREIGN PATENT DOCUMENTS

| | | |
|---|---|---|
| EP | 0 693 804 A2 | 1/1996 |
| WO | WO 2004/010538 A1 | 1/2004 |
| WO | WO 2008/004741 A1 | 1/2008 |

* cited by examiner

… (US 7,883,340 B2)

ELECTROCOATED CONTACTS COMPATIBLE WITH SURFACE MOUNT TECHNOLOGY

CROSS-REFERENCE TO RELATED APPLICATIONS

This application is a continuation of U.S. patent application Ser. No. 12/349,484 filed Jan. 6, 2009 (now U.S. Pat. No. 7,625,218 which issued Dec. 1, 2009) which, in turn, was a continuation of U.S. patent application Ser. No. 11/757,819 filed Jun. 4, 2007 (now U.S. Pat. No. 7,488,181 which issued Feb. 10, 2009), which, in turn, claimed the benefit of U.S. Provisional Application No. 60/879,393 filed Jan. 9, 2007. The entire disclosures of each of the above applications are incorporated herein by reference in their entirety.

FIELD

The present disclosure generally relates to electrocoated contacts that are compatible with surface mount technology (SMT) installation equipment and that are surface mountable, for example, to printed circuit boards to establish electrical contact from electrically-conductive portions on the PCBs to another electrically-conductive surface.

BACKGROUND

The statements in this section merely provide background information related to the present disclosure and may not constitute prior art.

Printed circuit boards usually include electrical components that radiate electromagnetic waves, which may cause noise or unwanted signals to appear in electrical devices existing within a certain proximity of the radiating electrical components. Accordingly, it is not uncommon to provide grounding for circuitry that emits or is susceptible to electromagnetic radiation, to thereby allow offending electrical charges and fields to be dissipated without disrupting operation.

To accomplish this grounding, some printed circuit boards are provided with pem-type standoffs. To this end, FIG. 1 illustrates a PCB grounding solution in which a conventional pem-type standoff 2 is being used for establishing electrical grounding contact from a ground trace on the PCB 1 to an electromagnetic interference (EMI) ground surface or shield 3.

Additional grounding solutions may include customized contacts that are designed specifically for the particular application. In such applications, the custom design usually depends, for example, on the exact printed circuit board layout and configuration. Other grounding solutions require through holes on multi-layered boards, which may entail re-routing hundreds of ground traces. Plus, the need for additional grounding contacts frequently arises later during the PCB layout. Other example grounding solutions include metal spring-finger contacts or hard fasteners using nuts.

SUMMARY

According to various aspects, exemplary embodiments are provided of contacts that may be compatible with surface mount technology. The contacts may be surface mountable for establishing an electrical pathway (e.g., electrical grounding contact, etc.) from at least one electrically-conductive surface on a substrate to another electrically-conductive surface (e.g., EMI shield, battery contact, etc.). In one exemplary embodiment, a contact generally includes a resilient dielectric core member. At least one outer electrically-conductive layer is electrocoated onto the resilient dielectric core member. A solderable electrically-conductive base member may be coupled to the resilient core member and/or the outer electrically-conductive layer. The base member may be in electrical contact with the outer electrically-conductive layer.

Additional aspects relate to methods of making contacts that may be compatible with surface mount technology and that may be surface mountable for establishing an electrical pathway (e.g., electrical grounding contact, etc.) from at least one electrically-conductive surface on a substrate to another electrically-conductive surface (e.g., EMI shield, battery contact, etc.). In one exemplary embodiment, a method generally includes insert molding a resilient dielectric material to a solderable electrically-conductive base member. The method may also include electrocoating at least one electrically-conductive layer onto the resilient dielectric material, such that the electrocoated electrically-conductive material is in electrical contact with the solderable electrically-conductive base member.

Other aspects relate to methods of installing contacts on electrically-conductive surfaces or substrates. In such methods, the contact may have a resilient dielectric core with at least one electrically-conductive layer electrocoated thereon such that the electrocoated layer is in electrical contact with an electrically-conductive base of the contact. In one exemplary embodiment, a method generally includes feeding the contact to a surface mount technology (SMT) machine, picking up the grounding contact, disposing the contact onto an electrically-conductive surface, and attaching the contact to the electrically-conductive surface.

Further aspects and features of the present disclosure will become apparent from the detailed description provided hereinafter. In addition, any one or more aspects of the present disclosure may be implemented individually or in any combination with any one or more of the other aspects of the present disclosure. It should be understood that the detailed description and specific examples, while indicating exemplary embodiments of the present disclosure, are intended for purposes of illustration only and are not intended to limit the scope of the present disclosure.

DRAWINGS

The drawings described herein are for illustration purposes only and are not intended to limit the scope of the present disclosure in any way.

Figure 19:
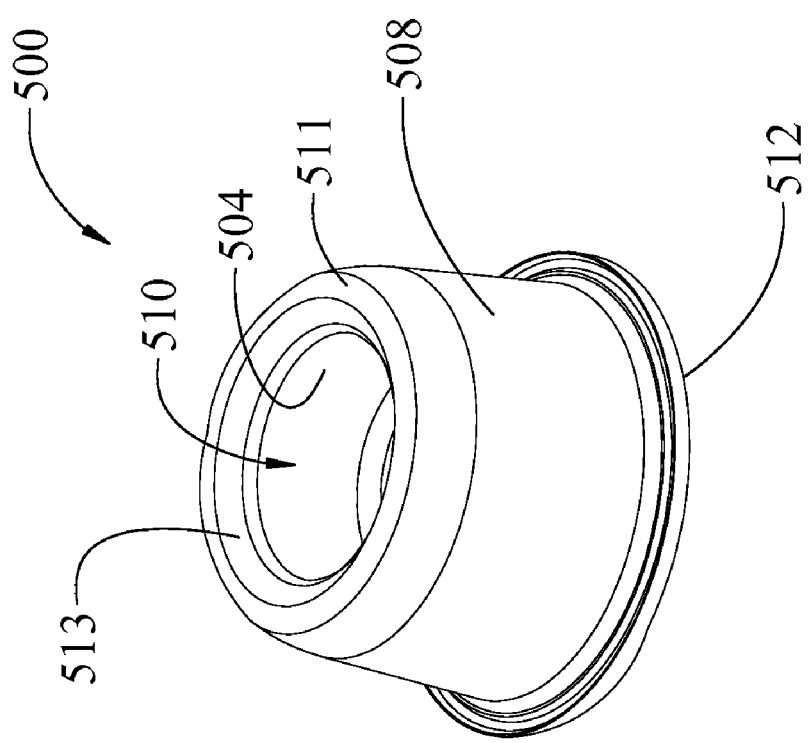
FIG. 19 is a perspective view of another exemplary embodiment of an electrocoated contact.
Figure 20:
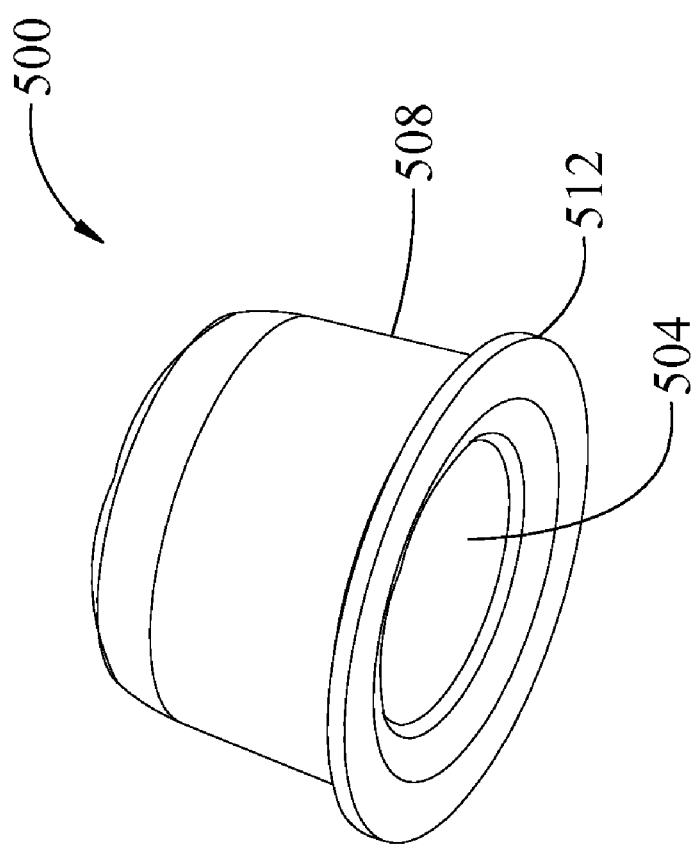
FIG. 20 is a lower perspective view of the electrocoated contact shown in FIG. 19.
Figure 21:
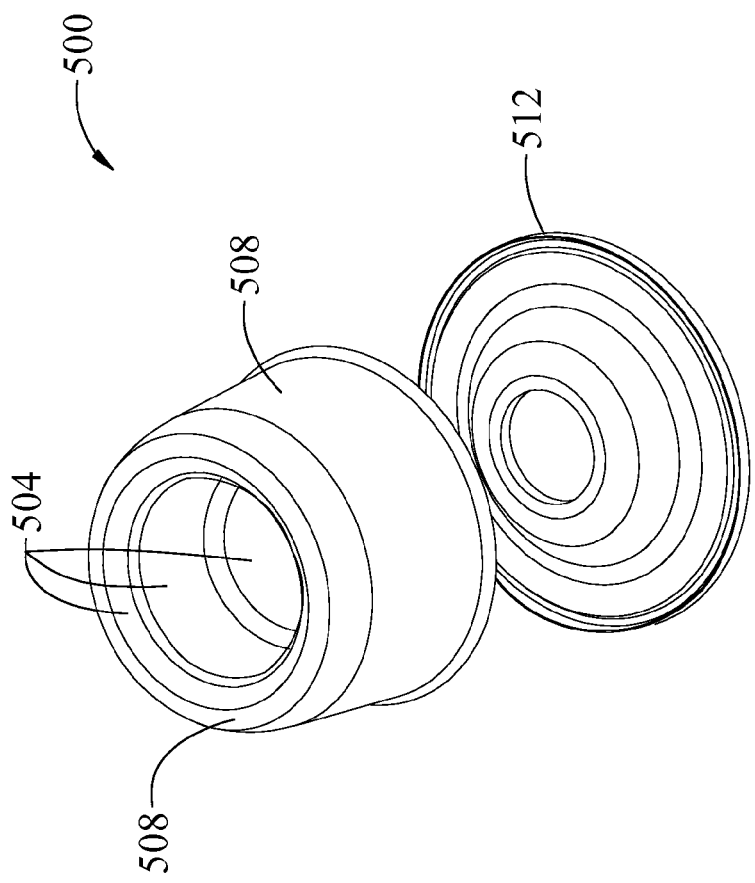
FIG. 21 is an exploded perspective view of the electrocoated contact shown in FIG. 19.
Figure 22:
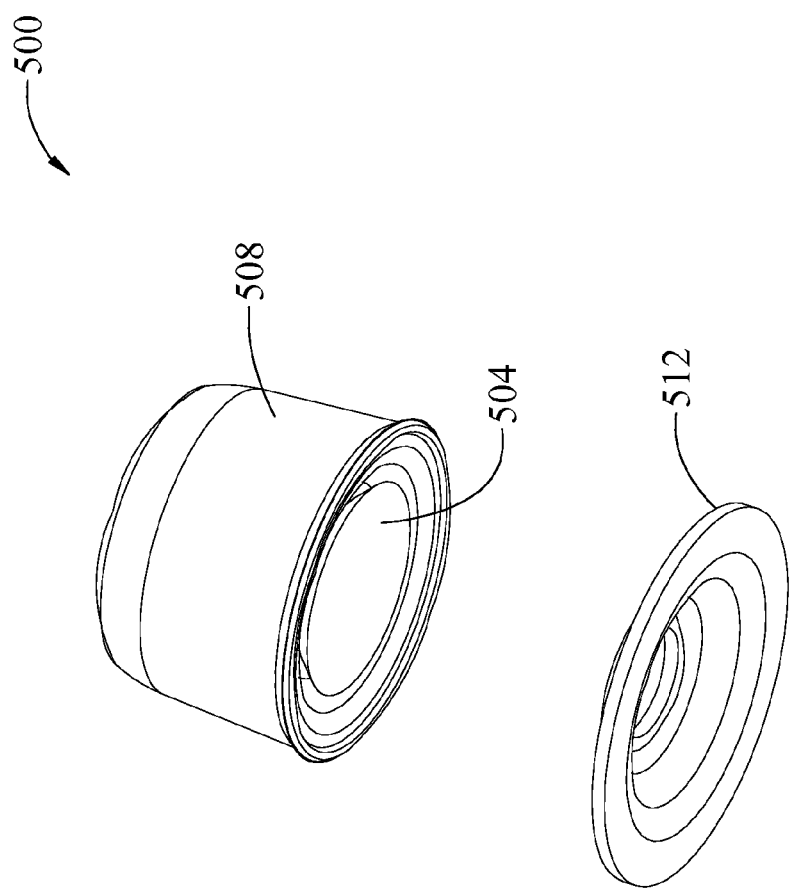
FIG. 22 is another exploded perspective view of the electrocoated contact shown in FIG. 19.
Figure 23:
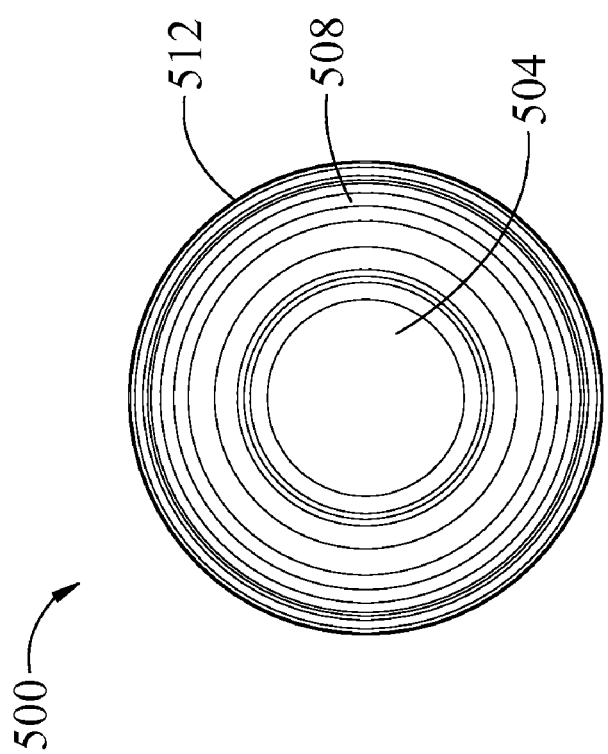
FIG. 23 is a top plan view of the electrocoated contact shown in FIG. 19.
Figure 24:
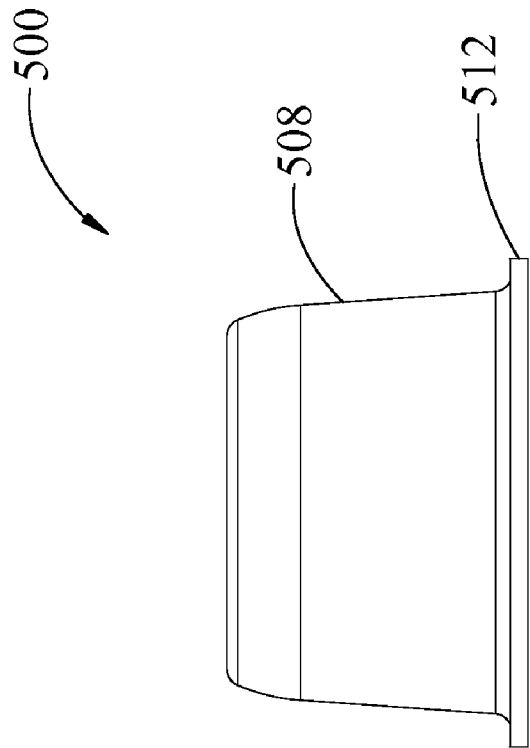
FIG. 24 is a side elevation view of the electrocoated contact shown in FIG. 19.
Figure 25:
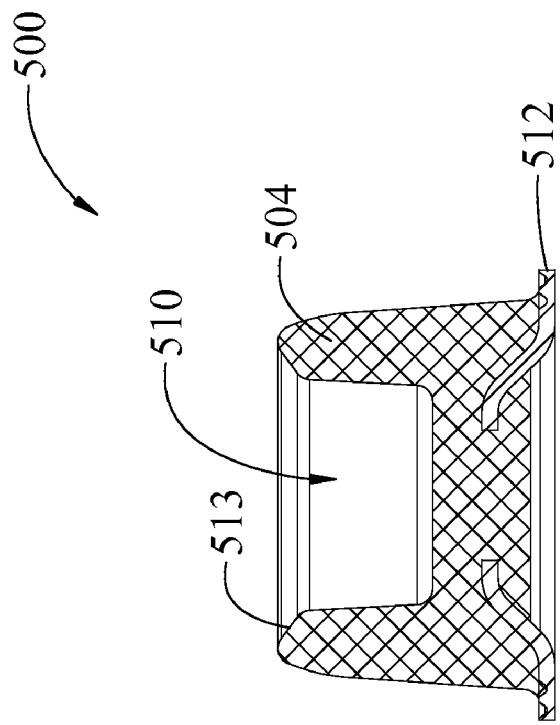
FIG. 25 is a cross-sectional view of the electrocoated contact shown in FIG. 19.
Figure 35:
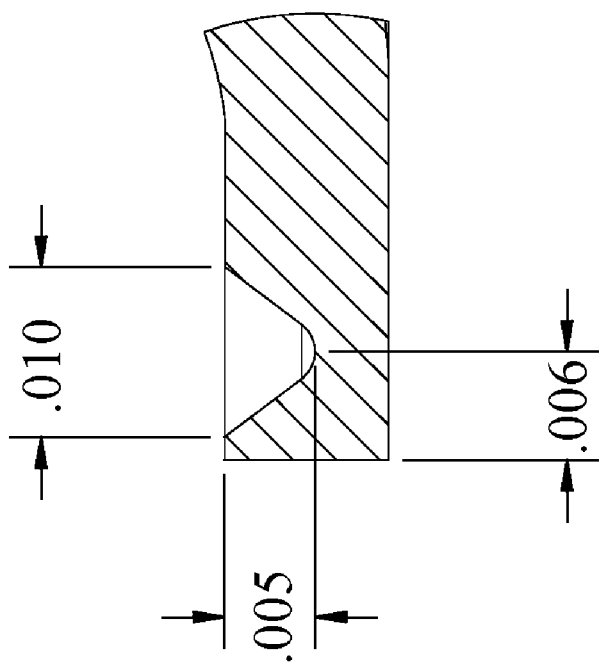
FIG. 35 is a view of the designated portion shown in FIG. 34 with exemplary dimensions provided for purposes of illustration only according to exemplary embodiments.
Figure 38:
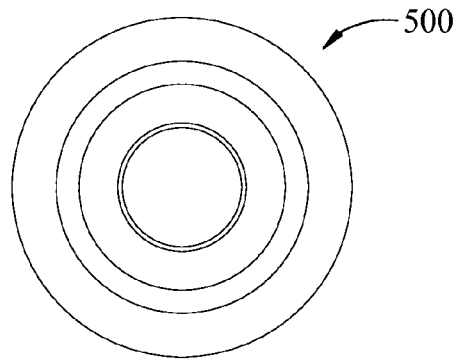
Figure 36:
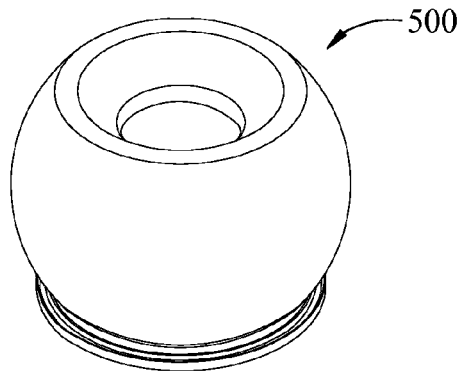
Figure 39:
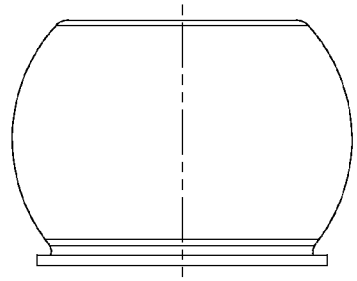
Figure 40:
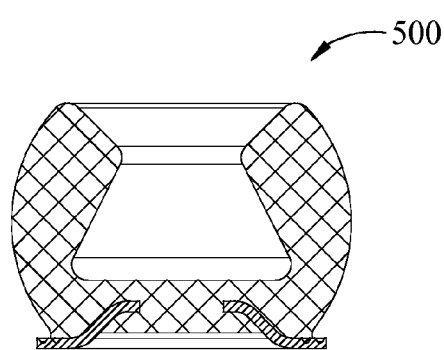
Figure 41:
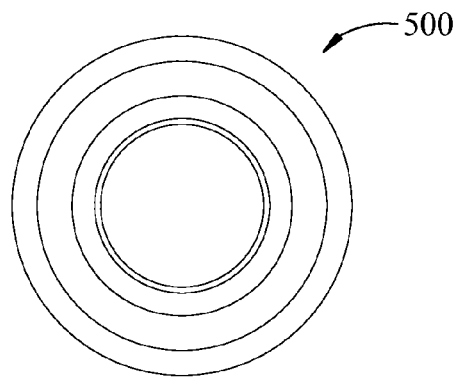
Figure 37:
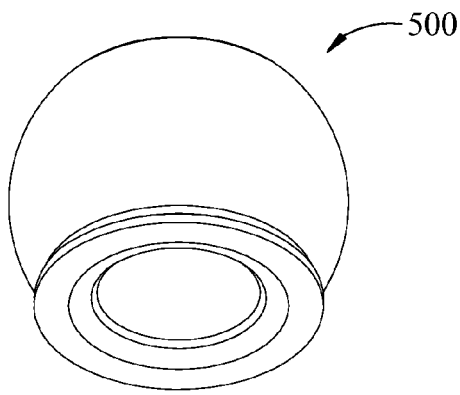
Figure 44:
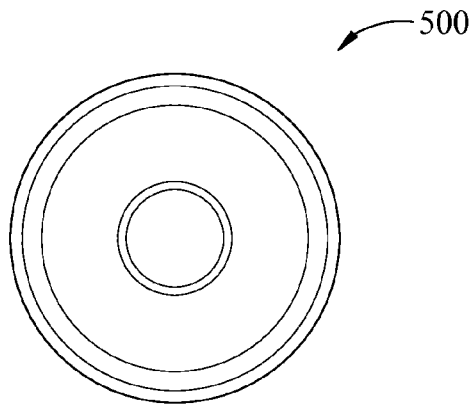
Figure 42:
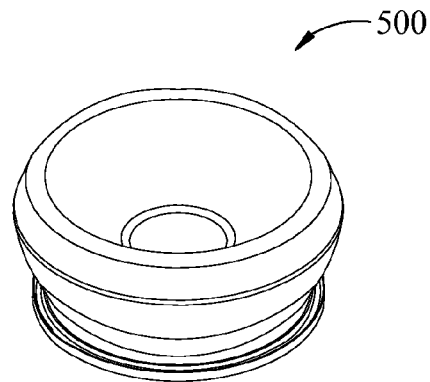
Figure 45:
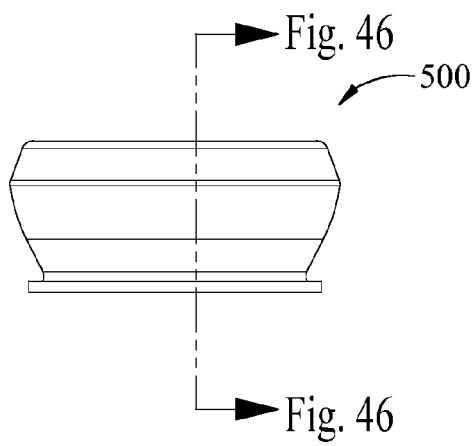
Figure 46:
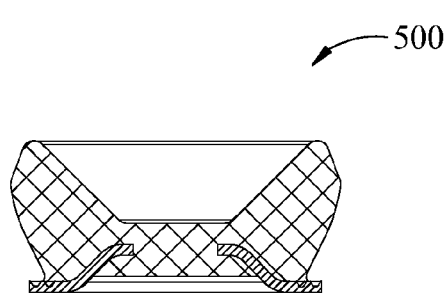
Figure 47:
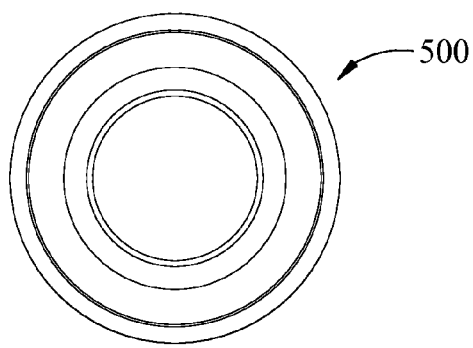
Figure 43:
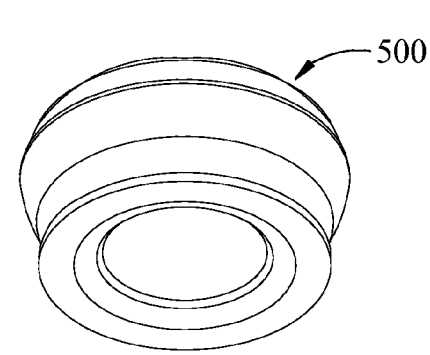

FIG. 36 is another perspective view of the electrocoated contact shown in FIG. 19 and illustrating the electrocoated contact's lip compressed generally inwardly and the electrocoated contact's upper portion compressed generally downwardly toward the lower portion of the electrocoated contact, for example, when the electrocoated contact is compressed between first and second surfaces such that a compressive load is applied generally downwardly against the lip, according to exemplary embodiments;

FIG. 37 is a lower perspective view of the electrocoated contact shown in FIG. 36;

FIG. 38 is a top plan view of the electrocoated contact shown in FIG. 36;

FIG. 39 is a side elevation view of the electrocoated contact shown in FIG. 36;

FIG. 40 is a cross-sectional view of the electrocoated contact shown in FIG. 39 taken along the line 40-40;

FIG. 41 is a bottom plan view of the electrocoated contact shown in FIG. 36;

FIG. 42 is another perspective view of the electrocoated contact shown in FIG. 19 and illustrating the electrocoated contact's lip compressed generally outwardly and the electrocoated contact's upper portion compressed generally downwardly toward the lower portion of the electrocoated contact, for example, when the electrocoated contact is compressed between first and second surfaces such that a compressive load is applied generally downwardly against the lip, according to exemplary embodiments;

FIG. 43 is a lower perspective view of the electrocoated contact shown in FIG. 42;

FIG. 44 is a top plan view of the electrocoated contact shown in FIG. 42;

FIG. 45 is a side elevation view of the electrocoated contact shown in FIG. 42;

FIG. 46 is a cross-sectional view of the electrocoated contact shown in FIG. 45 taken along the line 46-46; and FIG. 47 is a bottom plan view of the electrocoated contact shown in FIG. 35.

DETAILED DESCRIPTION

The following description is merely exemplary in nature and is in no way intended to limit the present disclosure, application, or uses. It should be understood that throughout the drawings, corresponding reference numerals indicate like or corresponding parts and features.

Figure 1:
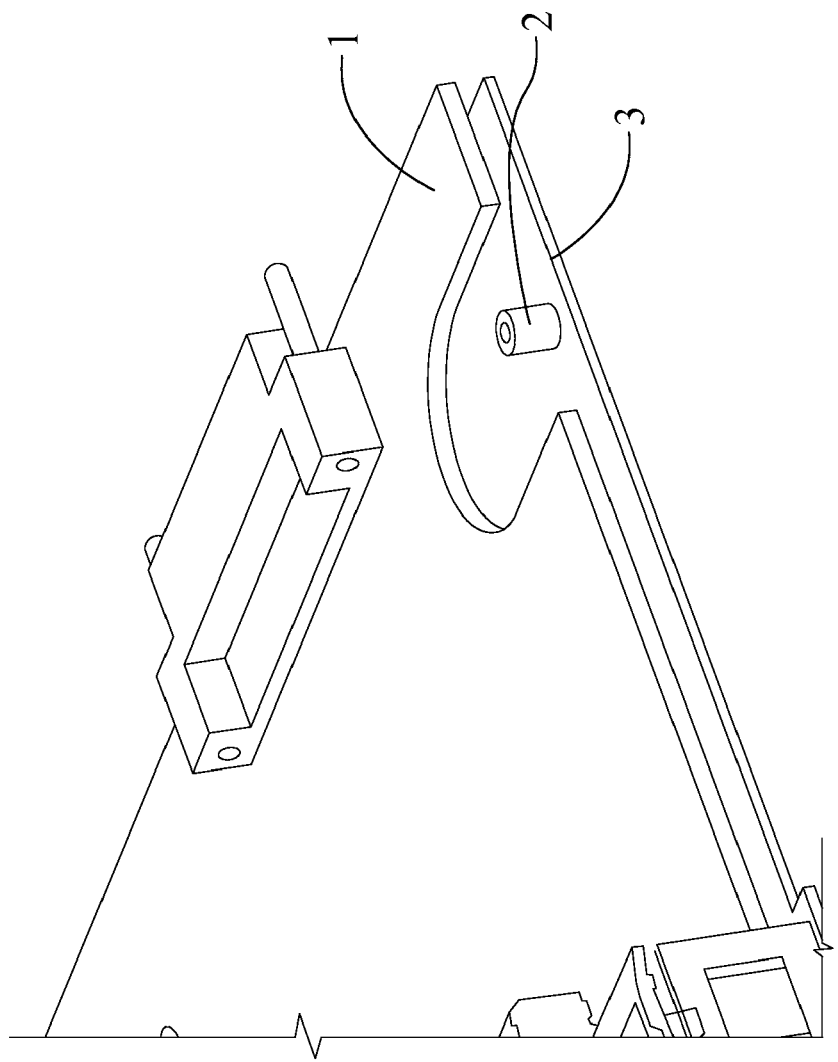
FIG. 1 is a perspective view of a PCB grounding solution with a portion of the PCB cutaway to illustrate a conventional pem-type standoff being used for establishing electrical grounding contact from a PCB ground trace to an electromagnetic interference (EMI) ground surface or shield and/or for providing structural stability.
Figure 2:
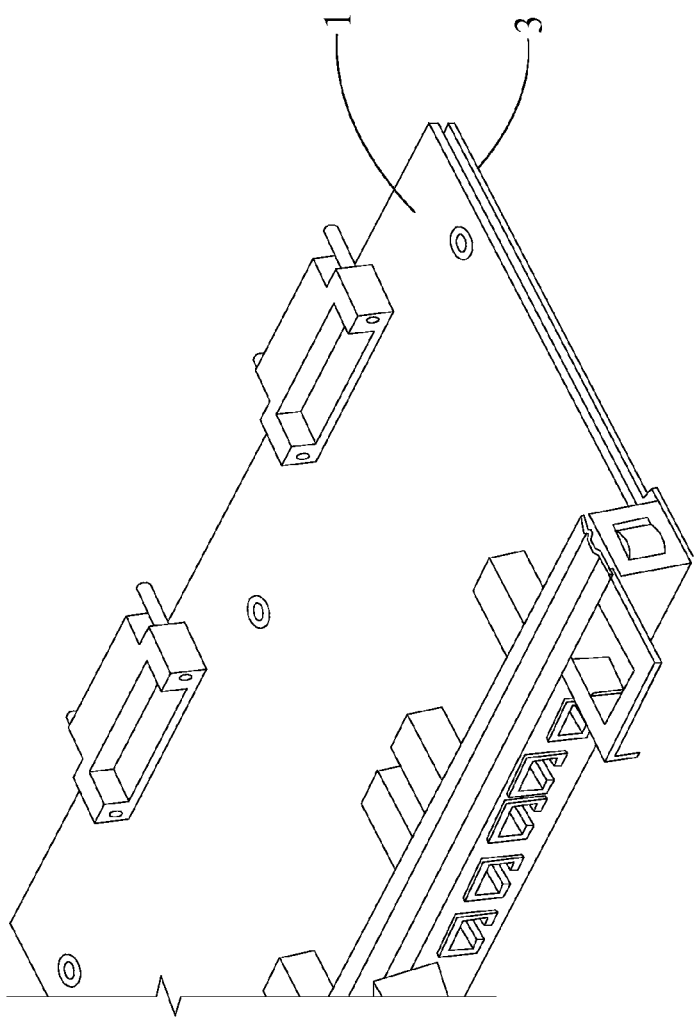
FIG. 2 is a perspective view of the PCB shown in FIG. 1.

As noted above, printed circuit boards usually include electrical components that radiate electromagnetic waves, which may cause noise or unwanted signals to appear in electrical devices existing within a certain proximity of the radiating electrical components. Accordingly, it is not uncommon to provide grounding for circuitry that emits or is susceptible to electromagnetic radiation, to thereby allow offending electrical charges and fields to be dissipated without disrupting operation. In addition to the pem-type standoffs shown in FIG. 1, additional grounding solutions may include customized contacts that are designed specifically for the particular application. In such applications, the custom design usually depends, for example, on the exact printed circuit board layout and configuration. Other grounding solutions require through holes on multi-layered boards, but the inventor hereof has recognized that this may entail re-routing hundreds of ground traces. Plus, the inventor hereof has also recognized that it is frequently necessary to add more grounding contacts later during the PCB layout. Other example grounding solutions include metal spring-finger contacts or hard fasteners using nuts.

Accordingly, disclosed herein are exemplary embodiments of contacts that may be compatible with surface mount technology. The contacts may be surface mountable, for example, to establish an electrical pathway (e.g., electrical grounding contact, etc.) from at least one electrically-conductive surface on a substrate (e.g., PCB ground trace, etc.) to another electrically-conductive surface (e.g., surface of an EMI shield, battery contact, etc.). In one exemplary embodiment, a contact generally includes a resilient dielectric core member (e.g., silicone rubber, neoprene foam, etc.). At least one outer electrically-conductive layer (e.g., one or more layers formed from silver and/or copper filled polyurethane, etc.) is electrocoated onto the resilient dielectric core member. A solderable electrically-conductive base member (e.g., tin-plated steel washer, etc.) is coupled to the resilient core member and/or the outer electrically-conductive layer. The base member is in electrical contact with the outer electrically-conductive layer.

It should be noted that various embodiments of the contacts disclosed herein may be used for different purposes. For example, exemplary uses of such contacts are disclosed herein as establishing electrical grounding contact from at least one electrically-conductive surface on a substrate (e.g., PCB ground trace, etc.) to another electrically-conductive surface (e.g., surface of an EMI shield, etc.). In some embodiments, one or more contacts disclosed herein may be used so as to provide a ground point only, whereby the contacts are not used with a high or steady enough electrical current to provide or accommodate data transmission unlike some "socket-style" connector assemblies having male and female connections specifically used for data transmission. Accordingly, the contacts disclosed herein may also be generally referred to herein as grounding contacts even though the grounding contacts may also or alternatively be used for other suitable purposes. One such alternative use that is contemplated relates to the formation of an electrically pathway between two electrically-conductive surfaces—one of which may be a battery contact or terminal.

In addition, some embodiments include a contact having a resilient core with at least one electrically-conductive layer electrocoated thereon, without any metal washer as the base member. Other embodiments include a contact having a resilient core with at least one electrically-conductive layer electrocoated thereon and a dielectric or electrically non-conductive washer forming the base member.

Further, some embodiments include a contact that may not be compatible with surface mount technology. In such embodiments, the contact may be installed, for example, to a PCB by hand or other mechanical means.

Additional aspects relate to methods of making contacts that may be compatible with surface mount technology and that may be surface mountable for establishing an electrical pathway (e.g., electrical grounding contact, etc.) from at least one electrically-conductive portion on the substrate to another electrically-conductive surface (e.g., EMI shield, battery terminal or contact, etc.). In one exemplary embodiment, a method generally includes insert molding a resilient dielectric material to a solderable electrically-conductive base member. The method may also include electrocoating at least one electrically-conductive layer onto the resilient dielectric material, such that the electrocoated layer is in electrical contact with the solderable electrically-conductive base member.

Other aspects relate to methods of installing contacts on electrically-conductive surfaces of substrates. In such methods, the contact may have a resilient dielectric core with at least one electrically-conductive layer electrocoated thereon such that the electrocoated layer is in electrical contact with an electrically-conductive base of the contact. In one exemplary embodiment, a method generally includes feeding the contact to a surface mount technology (SMT) machine, picking up the contact, disposing the contact onto an electrically-conductive surface, and attaching the contact to the electrically-conductive surface.

In some exemplary embodiments, the contacts may be provided within pockets of a carrier tape for retrieval therefrom by pick-and-place equipment. In such embodiments, the contacts may be retrieved from the pockets and then placed by pick-and-place equipment onto substrates for establishing an electrical pathway (e.g., electrical grounding contact, etc.) from electrically-conductive surfaces or portions on the substrates to another surface, such as an electrically-conductive surface of an EMI shield or a battery terminal. The contacts may be configured so as to be compatible for pick up and placement by a head associated with pick-and-place equipment, such as a gripper, pneumatic head, vacuum pick-and-place head, suction cup pick-and-place head, etc.

Other embodiments include contacts that are not compatible with SMT equipment. In such embodiments, the contacts may be installed, for example, to a PCB by hand or other mechanical means. Moreover, even in those embodiments in which the contacts are compatible with SMT equipment, the installer may still choose to install such contacts by hand or by using other means besides SMT equipment.

Figure 3:
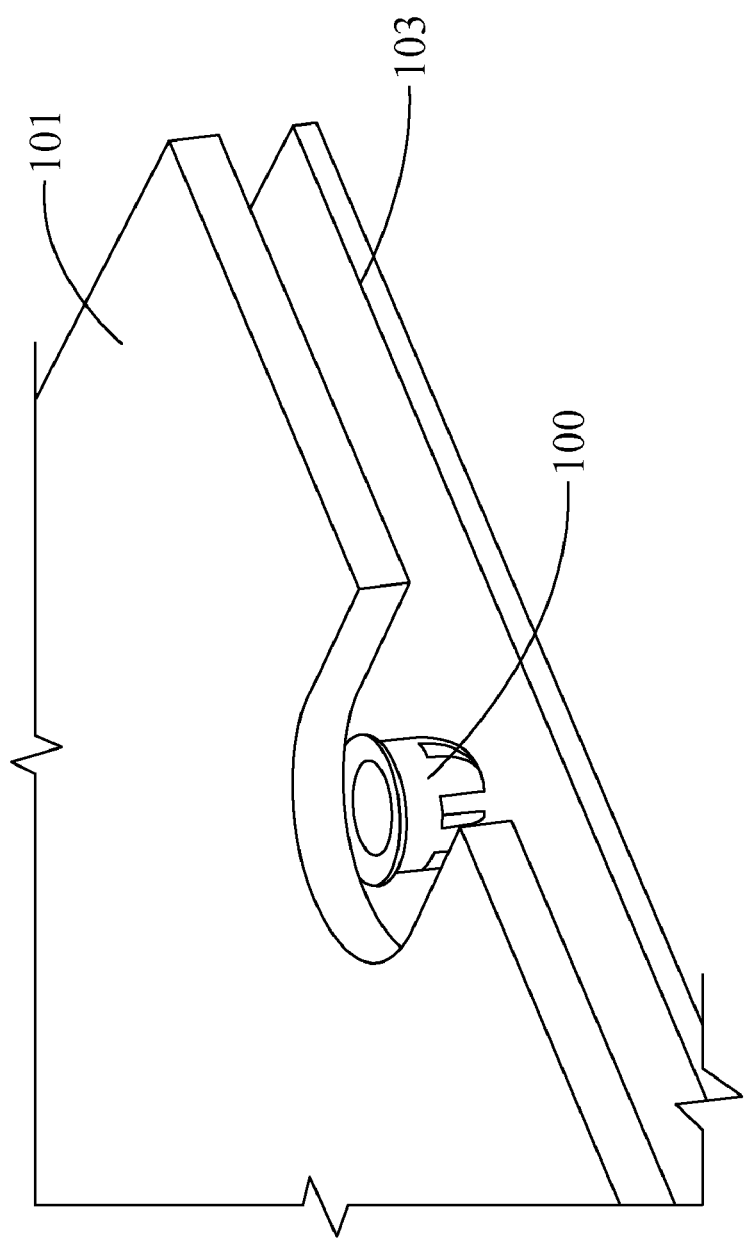
FIG. 3 is a perspective view of a PCB with a portion cutaway to illustrate an electrocoated contact according to exemplary embodiments of the present disclosure, which may be used for establishing electrical contact from an electrically-conductive ground trace on the PCB to a portion of an electromagnetic interference (EMI) shield mounted to the PCB.
Figure 4:
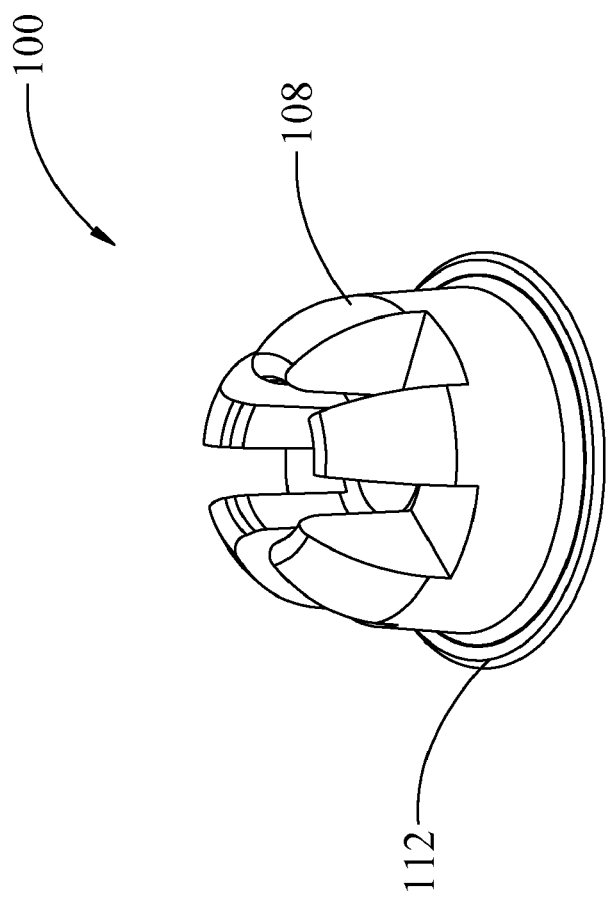
FIG. 4 is a perspective view of the electrocoated contact shown in FIG. 3.
Figure 5:
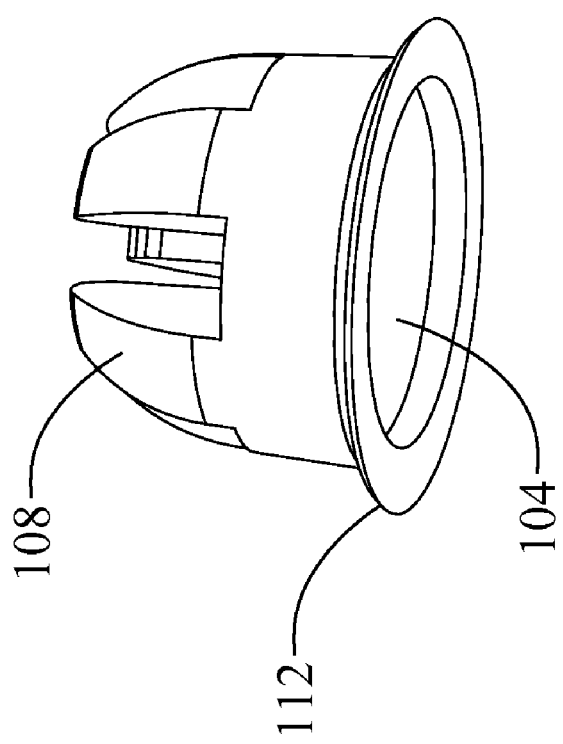
FIG. 5 is a lower perspective view of the electrocoated contact shown in FIG. 4.

FIGS. 3 through 5 illustrate an exemplary contact 100 embodying one or more aspects of the present disclosure. As shown in FIG. 3, the contact 100 is disposed generally between a PCB 101 and an EMI shield 103. In this position, the contact 100 may thus help establish electrical grounding contact from a PCB ground trace to an electrically-conductive portion of the EMI shield 103. Accordingly, the contact 100 may also be generally referred to herein as a grounding contact, even though the contact 100 may also or alternatively be used for other suitable purposes. One such alternative use contemplated for the contact 100 includes forming an electrically pathway between two electrically-conductive surfaces—one of which may be a battery contact or terminal.

The contact 100 may be bonded (e.g., soldered, adhesively bonded with an electrically-conductive adhesive, etc.) to the PCB ground trace in a manner so as to make good electrical contact with the PCB ground trace. In some embodiments, the contact 100 may also be compressed generally between the PCB 101 and the EMI shield 103 with sufficient contact pressure effective for establishing at least a certain or desirable level of electrical conductivity between the contact 100 and the PCB ground trace and EMI shield 103. In such embodiments, the PCB 101 and EMI shield 103 may cooperatively generate a sufficient compressive force to create sufficient contact pressure between the contact 100 and the PCB ground trace and/or between the contact 100 and the EMI shield 103 to establish good electrical conductivity therebetween.

In various embodiments, the contact 100 is configured to have a diameter of about 0.200 inches and a height of about 0.180 inches. In some embodiments, the contact 100 is configured for filling a gap from about 0.110 inches to about 0.160 inches. Alternative embodiments may include contacts configured differently and in different sizes. The dimensions provided in this paragraph (as are all dimensions disclosed herein) are for purposes of illustration only and not for purposes of limitation.

With reference to FIG. 5, the contact 100 includes a resilient core 104 and at least one electrically-conductive outer surface or layer 108 (e.g., outer shell formed from one or more electrically-conductive materials or layers, etc.). The contact 100 also includes an electrically-conductive, solderable base member or supporting layer 112. As used herein, the term "solderable" generally refers to the capability of being fused, joined, and/or metallurgically bonded with solder to form an electrically conductive joint, connection, or interface. In other embodiments, however, the contact may be configured without any solderable base member. In such alternative embodiments, the contact may instead be configured such that the electrocoating and/or core may be soldered directly to a board without any metal washer interface. Other embodiments include a contact having a resilient core with at least one electrically-conductive layer electrocoated thereon and a dielectric or electrically non-conductive washer forming the base member.

The contact 100 is preferably configured to allow for handling and processing by pick-and-place equipment for surface mounting, such as to a PCB (or other substrate). Advantageously, this may allow for relatively low-cost installation of contacts 100 to PCBs and other substrates. Even though the contact 100 may be configured for compatibility with SMT equipment, the installer may still choose to install a contact 100 by hand or by using other mechanical means besides SMT equipment. Plus, alternative embodiments may include contacts that are not compatible with surface mount technology.

The contact 100 may also be configured with a particularly shaped and sized base member 112 for inhibiting roll-over during the installation process, for example, after the contact 100 has been placed by the SMT equipment onto a PCB, but before the contact 100 has been soldered to the PCB ground trace. In some embodiments, the base member 112 is preferably formed from a solderable material, to thereby assist the contact 100 in being soldered to a PCB ground trace for establishing an electrically-conductive path from the contact 100 to the PCB ground trace.

Figure 6:
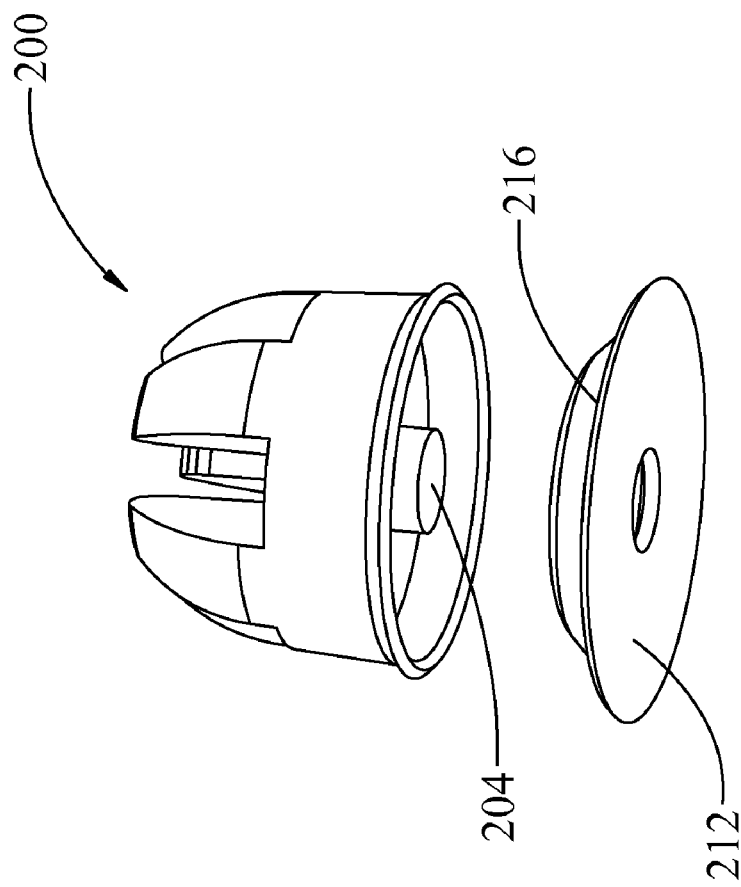
FIG. 6 is an exploded perspective view of an electrocoated contact having a machined washer according to exemplary embodiments.
Figure 7:
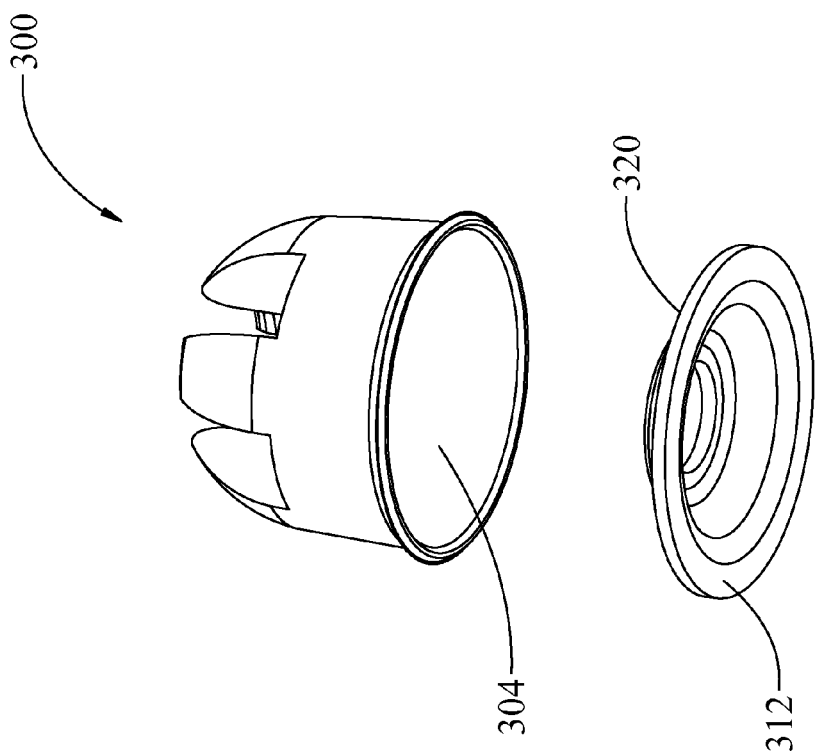
FIG. 7 is an exploded perspective view of an electrocoated contact having a stamped washer according to exemplary embodiments.

The base member 112 may be attached to the resilient core 104 by way of molding, adhesive, mechanical means (e.g., crimping, barbs, clips, etc.), other suitable methods, etc. By way of example, FIGS. 6 and 7 illustrate two different configurations for a metal washer that may be used for a contact 200, 300, respectively. As shown in FIG. 6, the contact 200 includes a machined washer 212. Advantageously, the machined washer 212 may be configured with an edge or shoulder 216, which may help or facilitate the dipping process associated with electrocoating. In other words, the edge or shoulder 216 may provide a suitable area for gripping and holding onto the washer 212 as the resilient dielectric material 204 is dipped and immersed into the container or bath having the material(s) to be electrocoated onto the dielectric material 204.

As shown in FIG. 7, the contact 300 includes a stamped washer 312. Advantageously, the stamped washer 312 may be configured with an under lip 320 for strengthening the bond between the washer 312 and the dielectric material 304.

Alternative materials, configurations, and manufacturing processes (e.g., drawing process, etc.) may be used for the base member of a contact depending, for example, on the particular application. For example, other embodiments may include washers fabricated by a drawing process and provided on a carrier, which, in turn, may also aid in the dipping or immersion of the contact during electrocoating.

Figure 8:
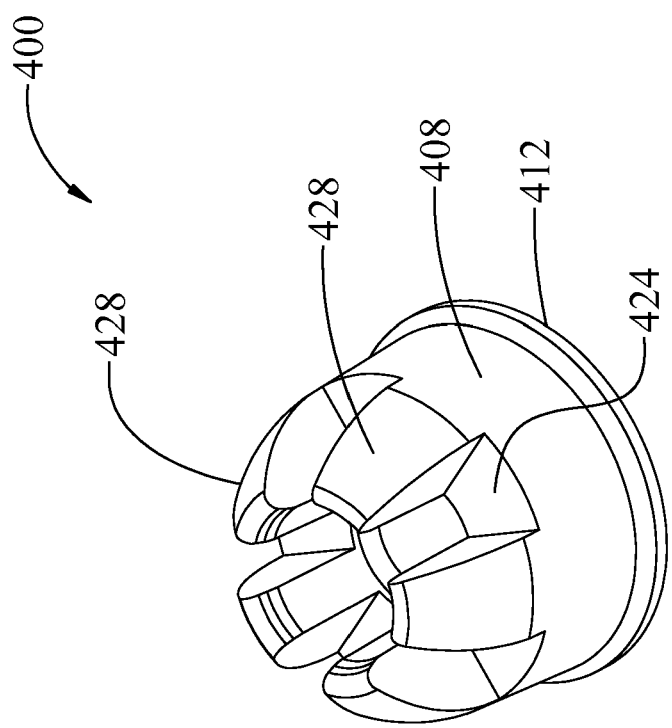
FIG. 8 is a perspective view of an electrocoated contact according to exemplary embodiments.
Figure 9:
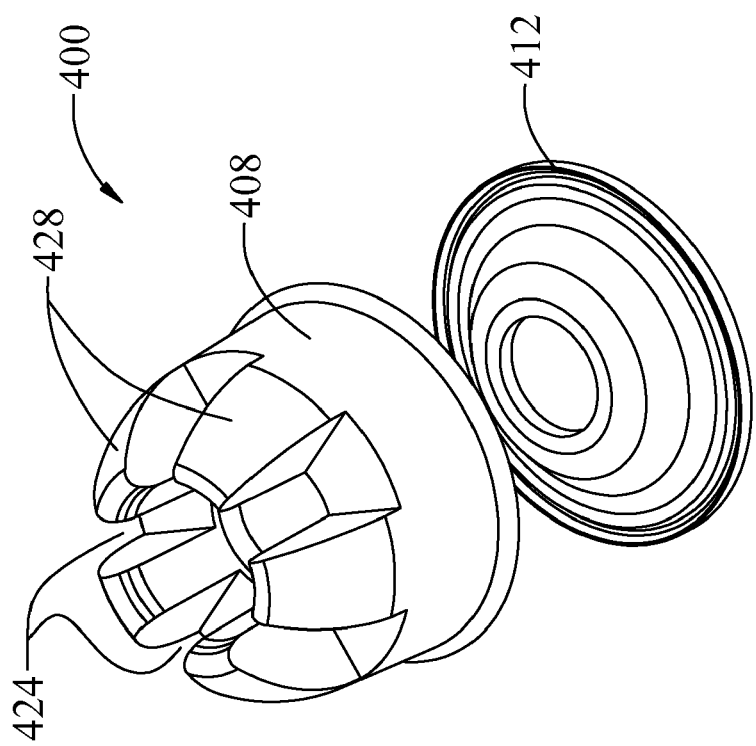
FIG. 9 is an exploded perspective view of the contact shown in FIG. 8 with the base member exploded away from the electrocoated resilient core.
Figure 10:
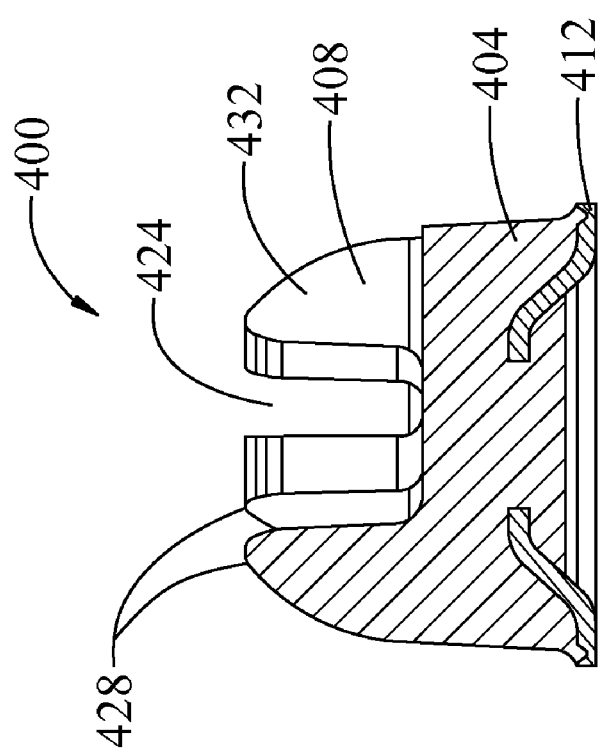
FIG. 10 is a cross-sectional view of the electrocoated contact shown in FIG. 8.

Referring now to FIGS. 8 through 10, there is illustrated a contact 400 embodying one or more aspects of the present disclosure. As shown, the contact 400 includes a resilient core 404 and at least one electrically-conductive outer surface or layer 408. The contact 400 also includes an electrically-conductive base member or supporting layer 412.

The contact 400 includes slots 424 that define finger elements 428 therebetween. The finger elements 428 may cooperatively define a generally rounded upper portion 432 (e.g., ogival, etc.) for the contact 400. The slots 424 may allow the finger elements 428 to flex independently from one another. Plus, the slots 424 and the resiliency of the inner core material (e.g., silicone rubber, neoprene foam, etc.) may also allow the finger elements 428 to be compressed inwardly towards one another and downwardly towards the base 412 when another surface bears against the contact's upper portion 432. This flexing or compression may occur, for example, when the contact 400 is compressively sandwiched between a PCB and an EMI shield, such that there is applied to the finger elements 428 a load or force with a downward component generally parallel to a longitudinal axis of the contact 400. When the loading surface is removed from being in contact with the finger elements 428 (e.g., after removing the EMI shield for servicing the PCB electrical components under the EMI shield, etc.), the resilient nature of the inner core material may then allow the finger elements 428 to return to their unloaded position. The material forming the contact's core 404 may preferably be selected so that during use of the contact 400, the yield point of the core material is not reached and no plastic deformation of the material occurs. Accordingly, these features may thus inhibit snagging of an EMI shield (or another surface) as the EMI shield is slidably moved in any direction relative to the upper portion 432 of the contact 400 during the installation procedure.

Alternative configurations (e.g., shapes, profiles, materials, more or less fingers and slots, etc.) are also possible for a contact, such as an embodiment in which the contact does not include any finger elements and slots. For example, FIGS. 19 through 25 illustrate a contact 500 that does not include any such finger elements and slots. The contact 500 does include a resilient dielectric core 504 having at least one electrically-conductive layer 508 electrocoated thereon. The contact 500 also includes an electrically-conductive base 512 (e.g., metal washer, etc.) in electrical contact with the electrically-conductive layer 508.

In some embodiments, the particular shape of the contact may also be customized or tailored for a particular installation. The particular configuration may depend, for example, on the space considerations and/or extent of the compression needed or desired in order to produce adequate contact pressure effective for establishing at least a certain or desirable level (e.g., minimal level in some embodiments, etc.) of electrical conductivity between the PCB and an EMI shield.

In the illustrated embodiment of FIGS. 8 through 10, the base member 412 is shown with a generally circular shape. Alternative embodiments may include non-circular base members depending, for example, at least in part on the shape and size of the allowable room or space for the contact 400 and/or particular substrate and electrically-conductive surface to which the contact 400 will be surface mounted.

The base member 412 may be attached to the resilient core 404 by way of molding, adhesive, mechanical means (e.g., crimping, barbs, clips, etc.), other suitable methods, etc. The particular method used, however, should preferably be able to withstand solder reflow temperatures (e.g., up to four hundred fifty degrees Fahrenheit, etc.) and retain its mechanical and electrical properties.

In some preferred embodiments, the inner resilient core 404 is insert molded to the base member 412. In other embodiments, an adhesive is used for attaching the base member 412. In these alternative embodiments, any suitable adhesive may be used as long as an electrical path is maintained between the base member 412 and the electrically-conductive outer layer 408. While some embodiments include an electrically-conductive adhesive (e.g., a particle filled electrically-conductive pressure-sensitive acrylic adhesive, etc.), other embodiments may include a dielectric or electrically non-conductive adhesive so long as at least a sufficient electrical path is maintained between the base member 412 and electrocoated layer 408.

A wide range of materials may be used for the various components of any of the contacts disclosed herein. For example, the contact 400 may have an inner resilient core 404 formed of a resiliently flexible, conformable, elastomeric, conformable, compliant, and/or compressible material, which may also be dielectric or electrically non-conductive. In some embodiments, the inner core 404 is formed from a relatively soft silicone rubber. Other embodiments include an inner core formed from neoprene foam. The inner core 404 may also be formed from a resiliently flexible material that is elastic in nature with a modulus of elasticity sufficient so that the finger elements 428 may be displaced by a force from an unloaded position to a loaded position, and then return to their unloaded position upon the removal of this force without exceeding the yield point of the material.

The electrically-conductive outer layer 408 may also be formed from a wide range of materials, which are preferably electrically-conductive materials capable of conducting electricity therethrough with impedance low enough sufficient for EMI applications. In one particular embodiment, the outer layer 408 comprises silver and/or copper filled polyurethane that has been electrocoated onto the core 404 in a layer having a thickness of about 0.015 inches.

The base member 412 is preferably formed from an electrically-conductive solderable material. The base member 412 is also preferably formed from a sufficiently stiff or rigid material so as to impart sufficient stiffness to the contact 400 to permit the contact 400 to be effectively handled and processed with existing SMT machines. Accordingly, a wide range of materials may be used for the base member 412 including metals, plastics coated with solderable electrically-conductive materials (e.g., copper, nickel, gold, silver, tin, etc.), among other suitable materials. In one particular embodiment, the base member 412 is formed from cold rolled steel ½ hard with a thickness of about 0.010 inches and which is tin-plated with a plating thickness from about 0.000050 inches to about 0.000100 inches. Alternatively, other suitable materials and dimensions may be used for the base member 412. For example, some embodiments include a base member formed from a dielectric or electrically non-conductive material. In still further embodiments, the contact is configured such that the contact does not include any washer forming the base member. In these embodiments, the electrocoating and/or resilient core material may be configured to allow for direct soldering to a board without a metal washer interface.

FIGS. 19 through 25 illustrate another preferred embodiment of a contact 500 that includes a resilient dielectric core 504 having at least one electrically-conductive layer 508 electrocoated thereon. The contact 500 also includes an electrically-conductive base 512 (e.g., metal washer, etc.) in electrical contact with the electrically-conductive layer 508. In the illustrated embodiment shown in FIG. 19, the sidewalls of the cavity 510 of the contact 500 are not electrocoated such that the resilient dielectric core 504 remains exposed. But the top surface portion 511 of the contact 500 is electrocoated (or otherwise provided with electrically-conductive material) so as to be electrically-conductive. The tapered or slanted surface portions 513 of the contact 500 may also be electrocoated (or otherwise provided with electrically-conductive material) so as to be electrically-conductive in some, but not necessarily all, embodiments. Alternative embodiments may include the substantial entirety of the inside walls of the cavity 510 being electrocoated (or otherwise provided with electrically-conductive material) such that the resilient dielectric core 504 is substantially covered and unexposed. In various embodiments, the thickness of the electrically-conductive layer 508 may provided or applied (e.g., electrocoated, sprayed, etc.) to the resilient dielectric core 504, such that the thickness of the electrically-conductive layer 508 is relatively small (and thus not illustrated in the cross-sectional views of FIGS. 25 and 30) in comparison to the thickness of the other components, such as the resilient dielectric core 504 and base 512.

Figure 26:
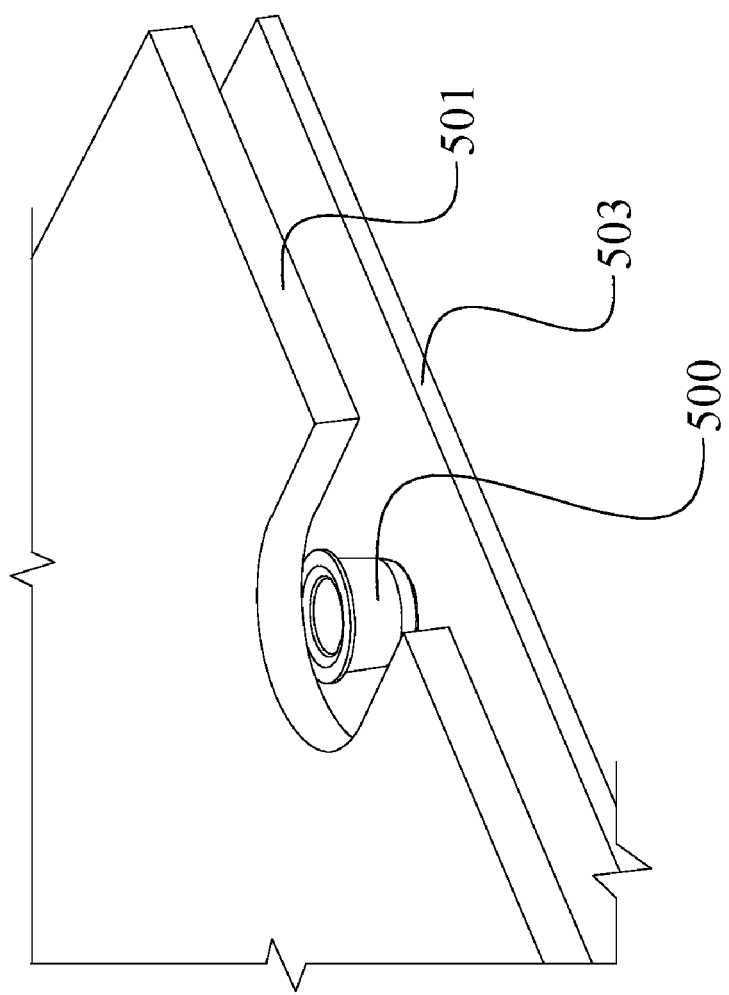
FIG. 26 is a perspective view of a PCB with a portion cutaway to illustrate the electrocoated contact shown in FIG. 19, whereby the electrocoated contact may be used for establishing electrical contact from an electrically-conductive ground trace on the PCB to a portion of an electromagnetic interference (EMI) shield mounted to the PCB according to exemplary embodiments.

As shown in FIG. 26, the contact 500 is disposed generally between a PCB 501 and an EMI shield 503. In this position, the contact 500 may thus help establish electrical grounding contact from a PCB ground trace to an electrically-conductive portion of the EMI shield 503. Accordingly, the contact 500 may also be generally referred to herein as a grounding contact, even though the contact 500 may also or alternatively be used for other suitable purposes. One such alternative use contemplated for the contact 500 includes forming an electrically pathway between two electrically-conductive surfaces—one of which may be a battery contact or terminal.

Figure 27:
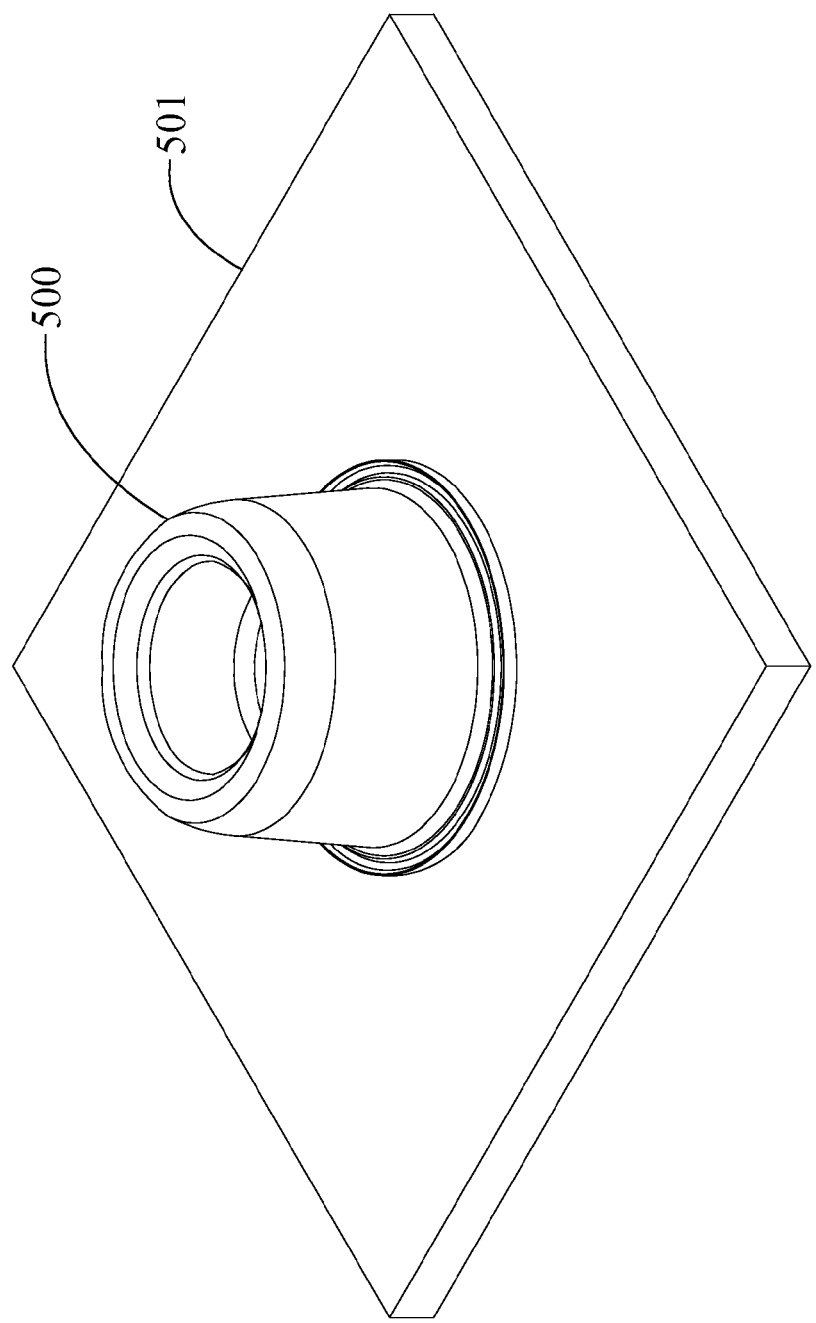
FIG. 27 is a partial perspective view illustrating an exemplary manner by which the electrocoated contact of FIG. 19 may be surface mounted to a PCB according to exemplary embodiments.
Figure 28:
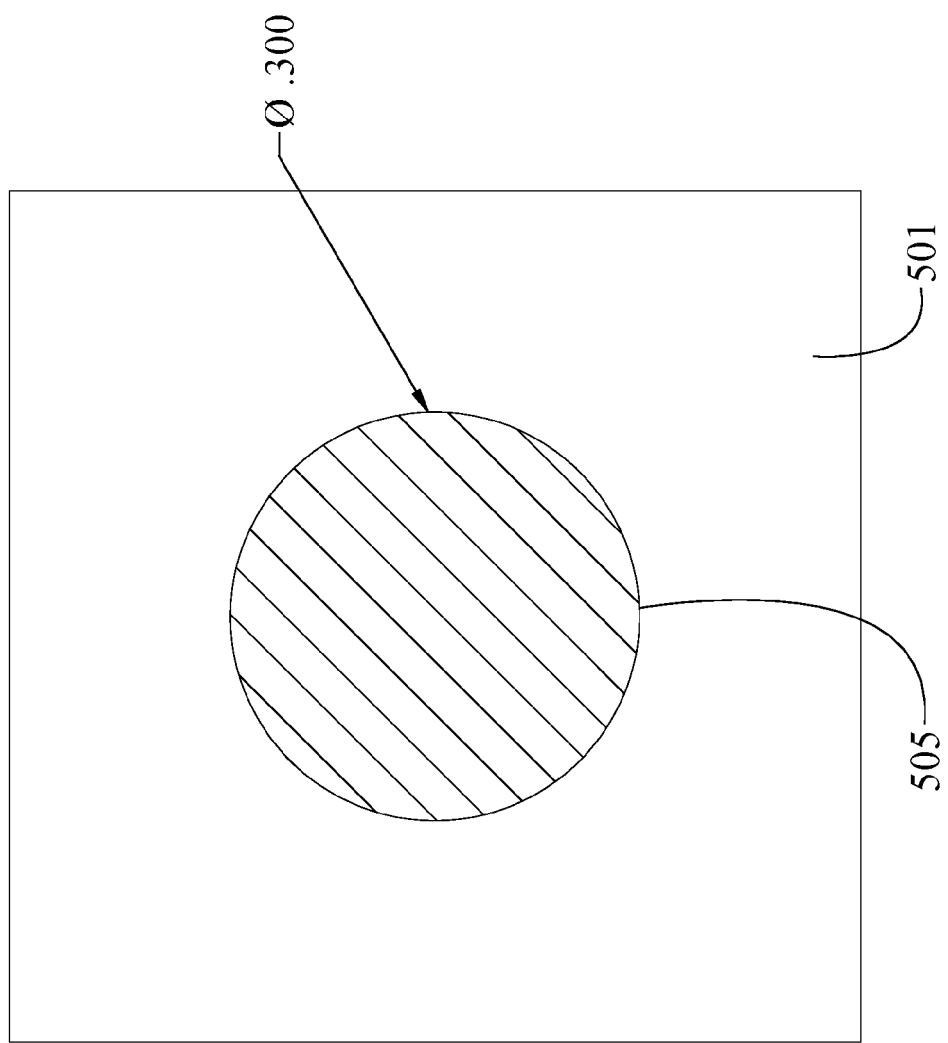
FIG. 28 is a top plan view of an exemplary solder pad that may be used when surface mounting the electrocoated contact of FIG. 19 to a PCB with an exemplary diameter dimension provided for purposes of illustration only according to exemplary embodiments.

The contact 500 may be bonded (e.g., soldered, adhesively bonded with an electrically-conductive adhesive, etc.) to the PCB ground trace in a manner so as to make good electrical contact with the PCB ground trace. For example, FIG. 27 illustrates the contact 500 surface mounted by to a PCB 501 by soldering the contact 500 to a solder pad 505 (FIG. 28) on the PCB 501. As shown in FIG. 28, the solder pad 505 may be generally circular in shape and have a diameter of about 0.300 inches. Alternatively, other solder pad configurations, shapes, sizes, etc. may be used depending, for example, on the particular PCB layout, space considerations, etc.

In some embodiments, the contact 500 may also be compressed generally between the PCB 501 and the EMI shield 503 with sufficient contact pressure effective for establishing at least a certain or desirable level of electrical conductivity between the contact 500 and the PCB ground trace and EMI shield 503. In such embodiments, the PCB 501 and EMI shield 503 may cooperatively generate a sufficient compressive force to create sufficient contact pressure between the contact 500 and the PCB ground trace and/or between the contact 500 and the EMI shield 503 to establish good electrical conductivity therebetween.

The tables below list various exemplary materials that may be used for a contact. The tables also provide various test results in order to further illustrate various aspects of the present disclosure and possible advantages thereof. These test specimens and exemplary test results are provided for purposes of illustration only, and not for purposes of limitation.

In the first table below, soft silicone rubber and silver/copper filled polyurethane having an electrocoated layer thickness of about 0.015 inches were tested to obtain certain material property data.

| Material Property | Test Method | Soft Silicone Rubber | Ag/Cu Filled Polyurethane |
|---|---|---|---|
| Specific Gravity | ASTM D792 | 1.0197 | 1.8632 |
| Hardness (Shore A) | ASTM D2240 | 23 | 92 |
| Tensile Strength (PSI) | ASTM D412 | 120.4 | 1278.2 |
| Elongation (%) | ASTM D412 | 494.6 | 63.9 |
| Tear Resistance (PPI), Die C | ASTM D624 | 31.3 | 214.8 |
| Volume Resistivity (ohm · centimeter) | MIL-DTL-83528C Paragraph 4.5.10 | N/A | 6.482 |
| Electrical Stability (ohm · centimeter) | MIL-DTL-83528C Paragraph 4.5.9 | N/A | 0.0054 |

The second table sets forth exemplary test results relating to the electrical performance of electrically-conductive electrocoating when exposed at relatively high temperature for relatively short periods of time, namely at five minutes and ten minutes. For this testing, the surface resistances of three different specimens were recorded before and after the specimens were exposed to two hundred thirty-five degrees Celsius in a convection oven for five minutes and ten minutes. The first specimen included silicone rubber that was electrocoated with silver/copper filled polyurethane to a coating thickness of about 0.015 inches. The second test specimen included neoprene foam that was electrocoated with silver/copper filled polyurethane to a coating thickness of about 0.015 inches. The third test specimen was electrically-conductive elastomer (EcE 50).

As can be observed from the test results in the table below, the electrically-conductive electrocoating did not show any signs of significant deterioration after the high temperature exposure.

| Foam/Rubber Type | Surface Resistance (Milliohms) | | |
|---|---|---|---|
| | Initial | After 5 minutes | After 10 minutes |
| E-Coated Silicone Rubber | 106 | 39 | 30 |
| E-Coated Neoprene | 96 | 26 | 25 |
| EcE 50 | 30 | 49 | 62 |

A description will now be provided of an exemplary process by which a particular embodiment of a contact (e.g., 100, 200, 300, 400, 500, etc.) may be made. In this example, a relatively low cost dielectric or electrically non-conductive material (e.g., silicone rubber, etc.) is insert molded onto an electrically-conductive washer (e.g., metal washer, etc.). By way of example, the insert molding may occur on a multiple cavity basis, such as twenty or so at a time.

An electrocoating process is then performed by dipping or immersing the dielectric material (which is insert molded to the washer) into a container (e.g., bath, etc.) having the material(s) to be electrocoated, such as silver/copper filled polyurethane. To facilitate the dipping process, the washer may have some sort of carrier (e.g., shoulder or ledge 216 shown in FIG. 6, etc.) to allow the product to be more easily dipped into the electrocoating bath using fixtures. Alternative processes besides dipping or immersing may also be employed for providing dielectric material with electrically-conductive material(s). For example, other embodiments may include spraying electrically-conductive material(s) onto the dielectric material.

During this electrocoating process, electrically-conductive material is electrocoated onto the dielectric material so as to create an electrical path between the electrocoating and the washer. The electrocoating generally allows the resulting contact to withstand the relatively high temperatures (e.g., up to about four hundred fifty degrees Fahrenheit, etc.) associated with solder reflow process while still retaining a relative low electrical resistance sufficient for EMI applications.

Even though contacts may be formed as described in the above paragraphs, such is not required for all embodiments. For example, other embodiments may include other processes besides electrocoating for providing the electrically-conductive outer layer to the resilient dielectric core material. Alternative configurations (e.g., shapes, sizes, etc.), materials, and manufacturing methods (e.g., drawing, etc.) may be used for making a contact. For example, other embodiments of the contact may be configured without any solderable base member, such as a metal washer. In such alternative embodiments, the contact may instead be configured to be soldered directly to a board without any metal washer interface. Further embodiments include a contact having a resilient core with at least one electrically-conductive layer electrocoated thereon and a dielectric or electrically non-conductive stiffener or base member, such as dielectric or electrically-conductive washer.

A description will now be provided of an exemplary process by which contacts may be installed onto a substrate using pick-and-place equipment (e.g., gripper, pneumatic head, vacuum pick-and-place head, suction cup pick-and-place head, etc.). In this example, the contacts (e.g., 100, 200, 300, 400, 500, etc.) may be stored in pockets of a continuous tape reel for retrieval by a head (not illustrated) of a pick-and-place machine, such as a gripper, pneumatic head, vacuum pick-and-place head, suction cup pick-and-place head, etc. The contacts may be positioned in the upwardly opening pockets of a plastic carrier tape. A cover strip may be adhesively applied to the top layer of the carrier tape to hold the contacts in position within the pockets. The carrier tape may be wound onto or wrapped around a reel before shipment to a customer. Upon receipt, the customer may install the reel (with the contacts in the pockets thereof) on a feeder of an automatic pick-and-place machine. The carrier tape may have holes formed along one or both side edges thereof for driving through a feeder mechanism installed in a pick-and-place machine. The tape, with the contacts stored within the pockets, and the cover layer in place, may be unwound from the supply reel in the feeder. The feeder peels back the top cover layer and the head (not illustrated) of the pick-and-place machine may use a gripper to pick-up a contact from its corresponding pocket in the tape. After retrieving the contact from the pocket, the head may then position the contact onto a PCB ground trace, which may have been pre-screened with solder-paste. The PCB and the contacts sitting atop the PCB ground traces may then be sent through a solder reflow oven (such as infrared—IR, vapor-phase, convection, etc.) to melt the solder joints and form an electrical and mechanical connection therebetween. By providing contacts capable of being retrieved from pockets and then placed onto PCBs by pick-and-place machines associated with assembly line production, embodiments disclosed herein may allow for increased productivity for assembly line production of printed circuit boards, etc.

An installer may still choose to install the contacts by hand or by using other mechanical means besides SMT equipment. Plus, alternative embodiments may include contacts that are not compatible with SMT technology.

Figure 11:
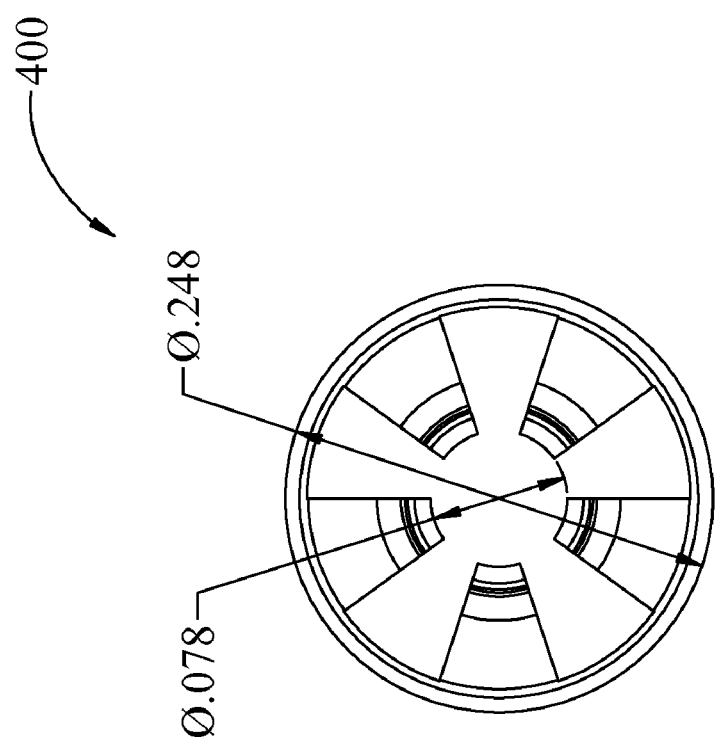
FIG. 11 is a top plan view of the electrocoated contact shown in FIG. 8 with exemplary dimensions provided for purposes of illustration only according to exemplary embodiments.
Figure 12:
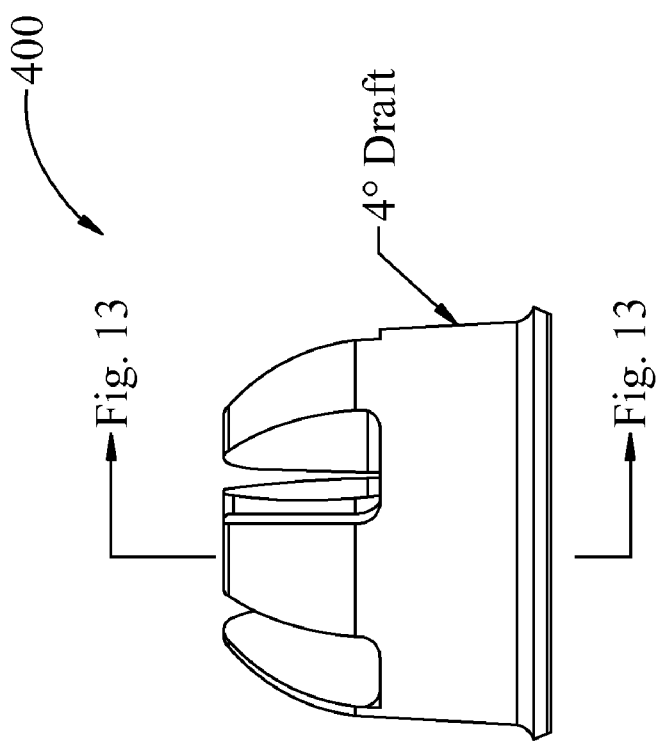
FIG. 12 is a side elevation view of the electrocoated contact shown in FIG. 8 with exemplary dimensions provided for purposes of illustration only according to exemplary embodiments.
Figure 13:
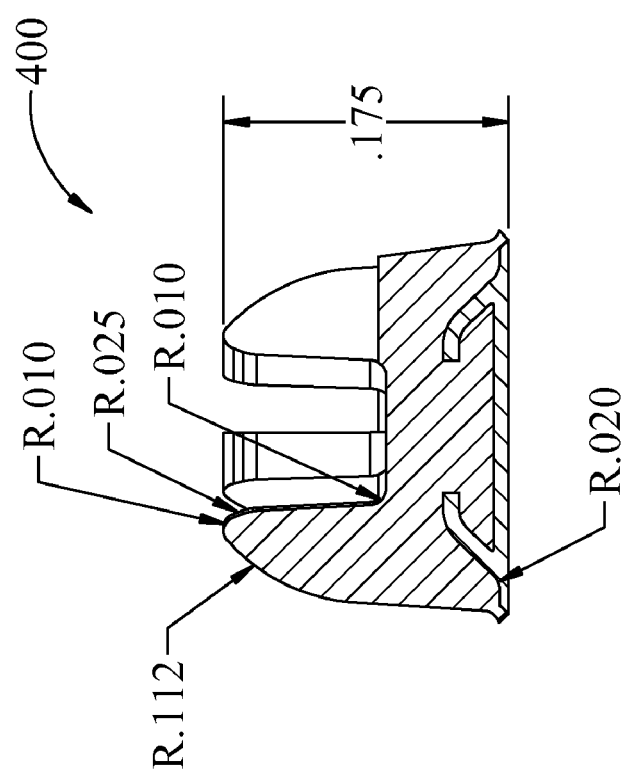
FIG. 13 is a cross-sectional view of the electrocoated contact taken along the line 13-13 in FIG. 12 with exemplary dimensions provided for purposes of illustration only according to exemplary embodiments.
Figure 14:
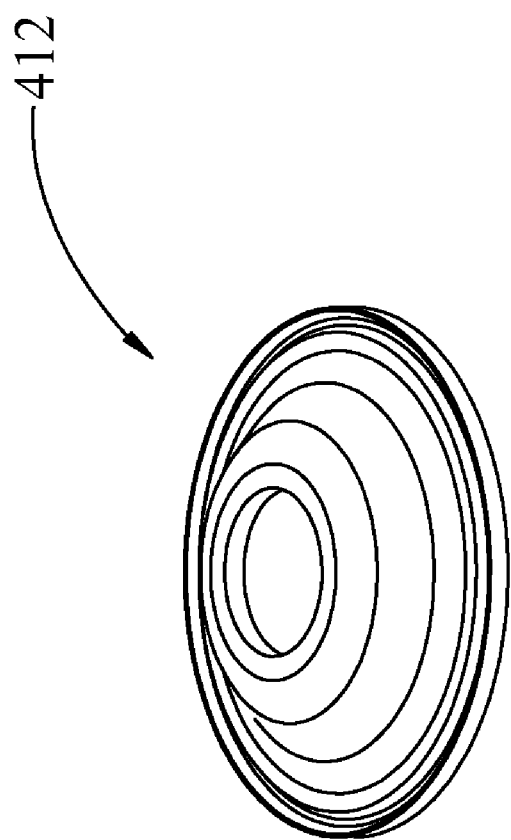
FIG. 14 is a perspective view of a washer that may be used as a base member or support layer for the electrocoated contact shown in FIG. 8 according to exemplary embodiments.
Figure 15:
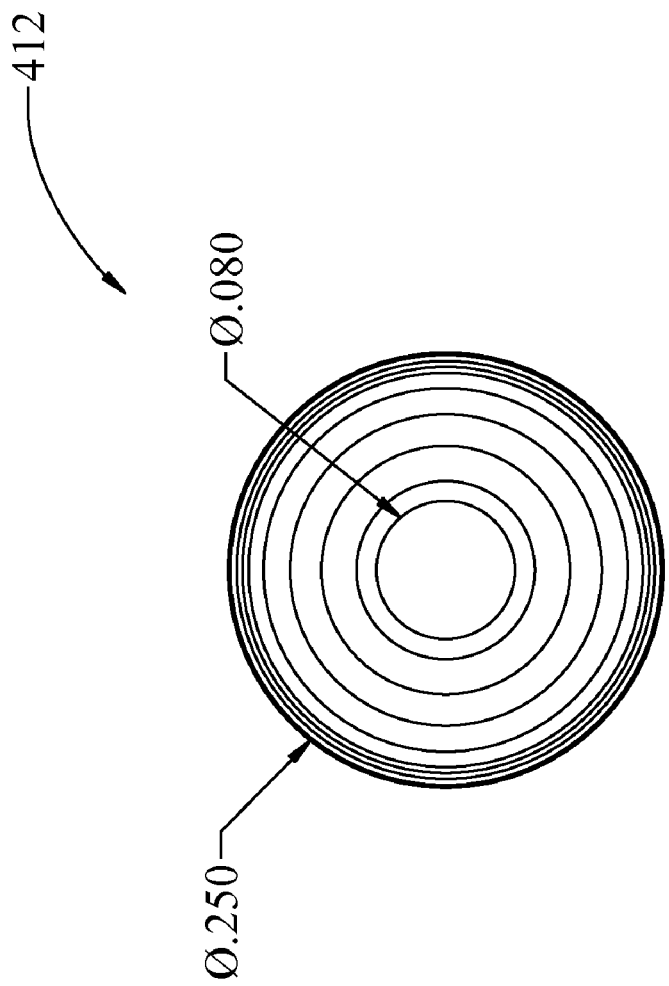
FIG. 15 is a top plan view of the washer shown in FIG. 14 with exemplary dimensions provided for purposes of illustration only according to exemplary embodiments.
Figure 16:
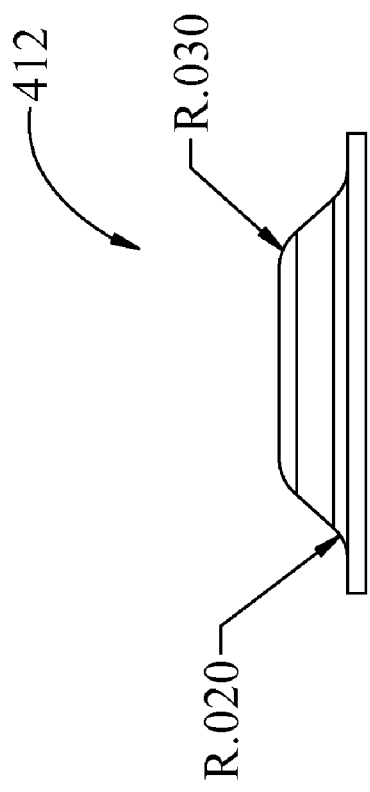
FIG. 16 is a side elevation view of the washer shown in FIG. 14 with exemplary dimensions provided for purposes of illustration only according to exemplary embodiments.
Figure 17:
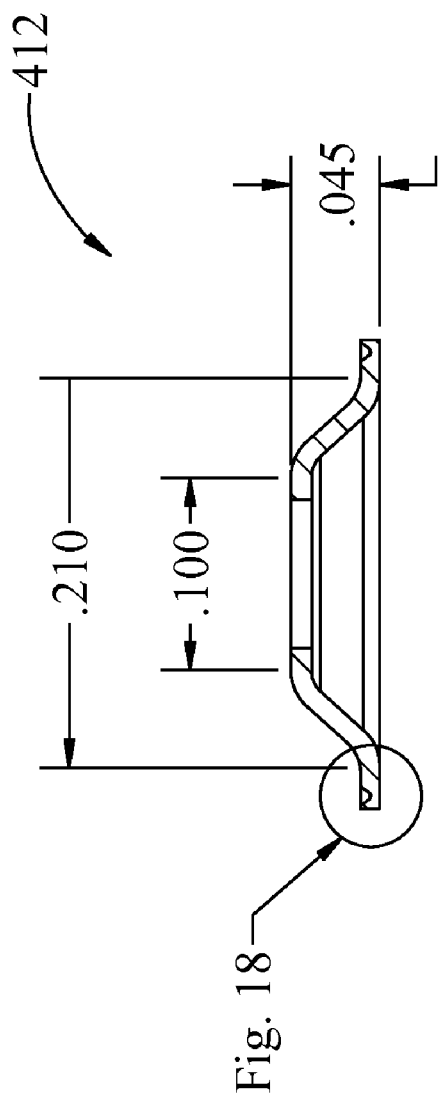
FIG. 17 is a cross-sectional view of the washer shown in FIG. 14 with exemplary dimensions provided for purposes of illustration only according to exemplary embodiments.
Figure 18:
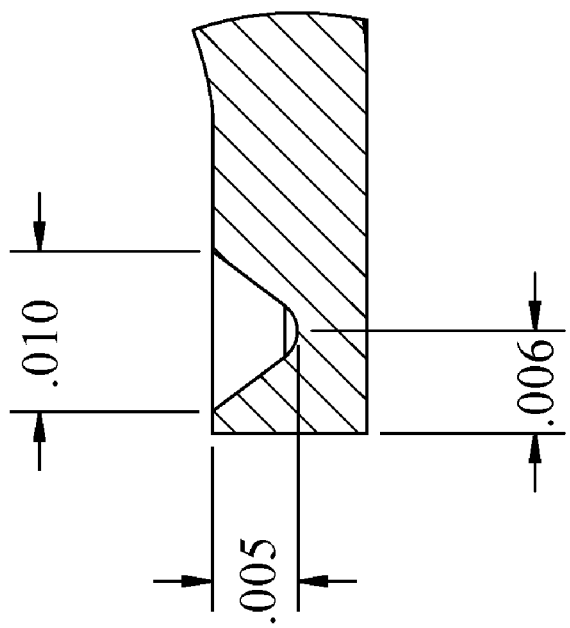
FIG. 18 is a view of the designated portion shown in FIG. 17 with exemplary dimensions provided for purposes of illustration only according to exemplary embodiments.

FIGS. 11 through 13 illustrate exemplary dimensions in inches that may be used for the contact 400 shown in FIGS. 8 through 10 for purposes of illustration only and not for purposes of limitation. In the particular embodiment shown in FIGS. 11 through 13, the contact 400 may comprise a resilient inner core formed from relatively soft silicone rubber, and an outer electrically-conductive layer formed by electrocoating silver and/or copper filled polyurethane onto the silicone rubber to a layer thickness of about 0.015 inches. The materials and dimensions provided herein are for purposes of illustration only as a contact may be configured from different materials and/or with different dimensions depending, for example, on the particular PCB layout, space considerations, etc.

FIGS. 14 through 18 illustrate an exemplary embodiment of a washer that may be used as the base member or support layer 412 for the contact 400 shown in FIG. 8. FIGS. 15 through 18 provide exemplary dimensions in inches that may be used for the washer 412 for purposes of illustration only and not for purposes of limitation. In the particular embodiment illustrated in FIGS. 15 through 18, the washer 412 may have the dimensions shown therein but with a tolerance of +/−0.010 inch for those dimensions shown to three decimal places. In this particular embodiment, the washer 412 may be formed from cold rolled steel ½ hard with a thickness of about 0.010 inches and which is tin-plated with a plating thickness from about 0.000050 inches to about 0.000100 inches. Alternative materials and dimensions may also be used. For example, the washer 412 (or other suitable base member) may be made thicker or thinner and/or with a smaller or larger diameter depending on the particular size of gap into which the contact will be positioned. Also, the washer 412 does not need to be circular, but may be any suitable shape (e.g., rectangular, oval, trapezoidal, parallelogram, etc.) depending upon the application.

Figure 29:
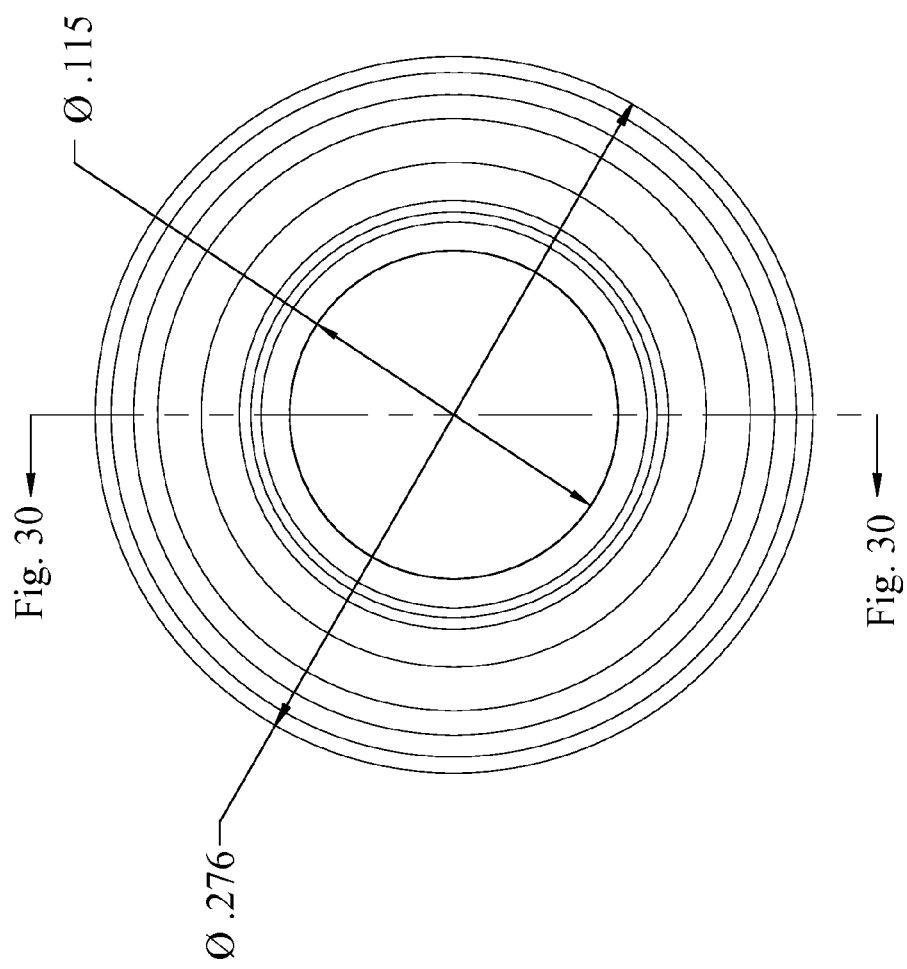
FIG. 29 is a top plan view of the electrocoated contact shown in FIG. 19 with exemplary dimensions provided for purposes of illustration only according to exemplary embodiments.
Figure 30:
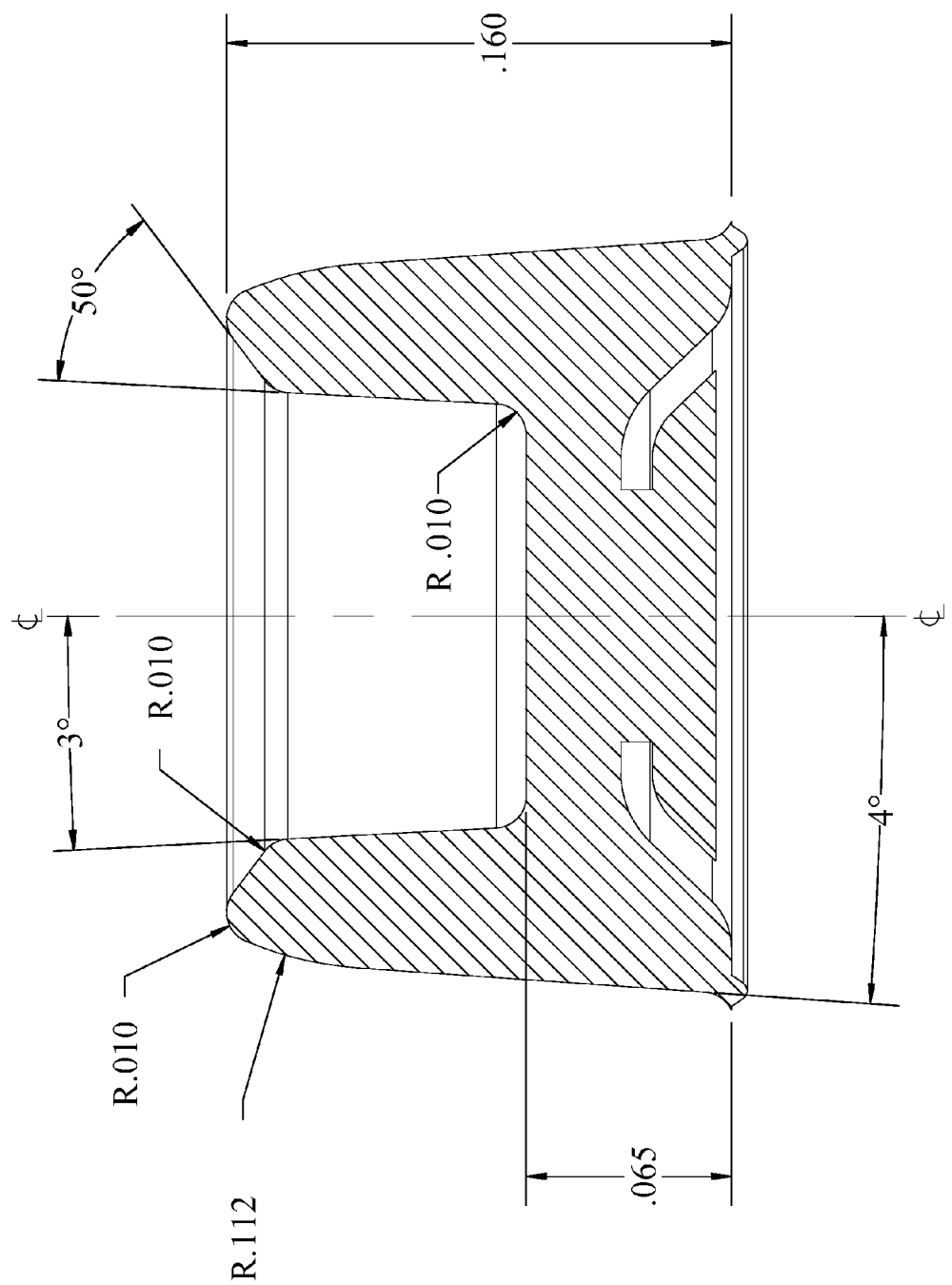
FIG. 30 is a cross-sectional view of the electrocoated contact shown in FIG. 19 with exemplary dimensions provided for purposes of illustration only according to exemplary embodiments.
Figure 31:
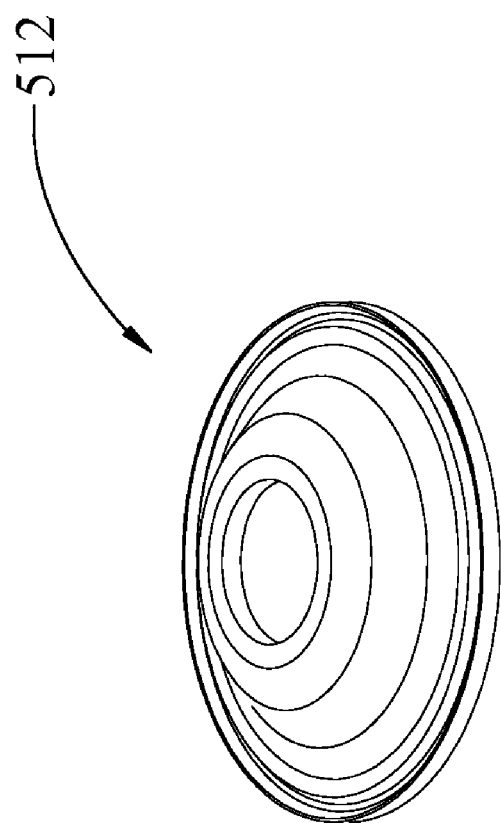
FIG. 31 is a perspective view of a washer that may be used as a base member or support layer for the electrocoated contact shown in FIG. 19 according to exemplary embodiments.
Figure 32:
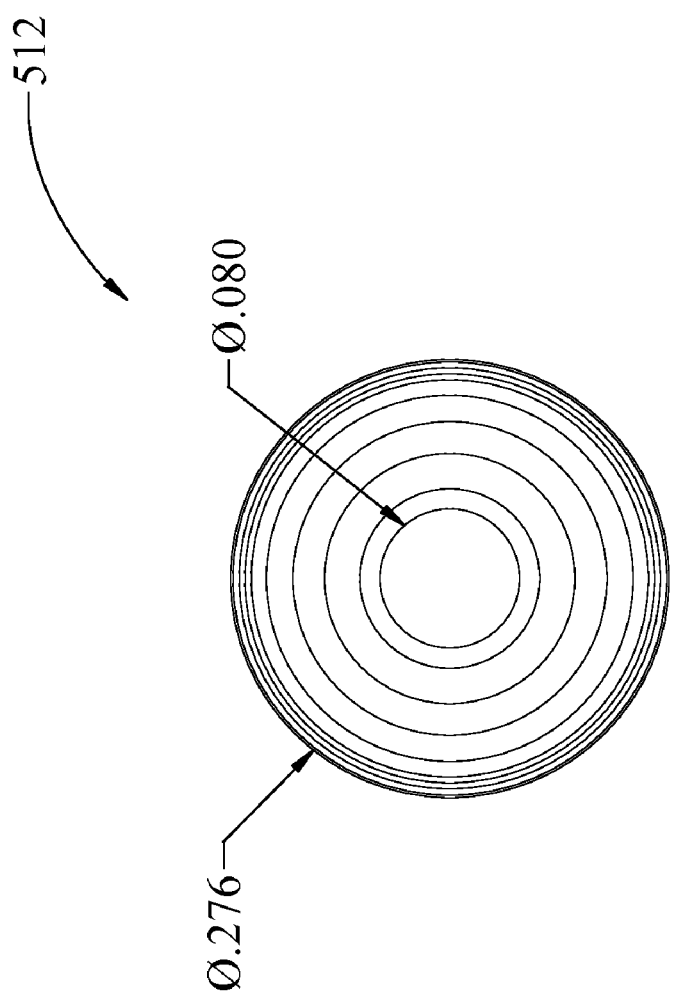
FIG. 32 is a top plan view of the washer shown in FIG. 31 with exemplary dimensions provided for purposes of illustration only according to exemplary embodiments.
Figure 33:
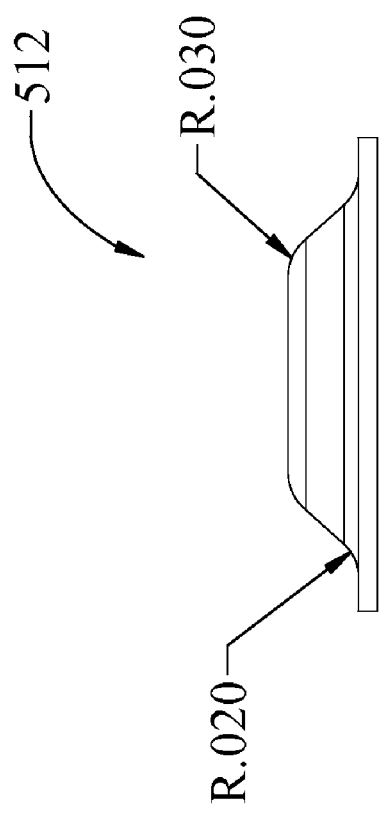
FIG. 33 is a side elevation view of the washer shown in FIG. 31 with exemplary dimensions provided for purposes of illustration only according to exemplary embodiments.
Figure 34:
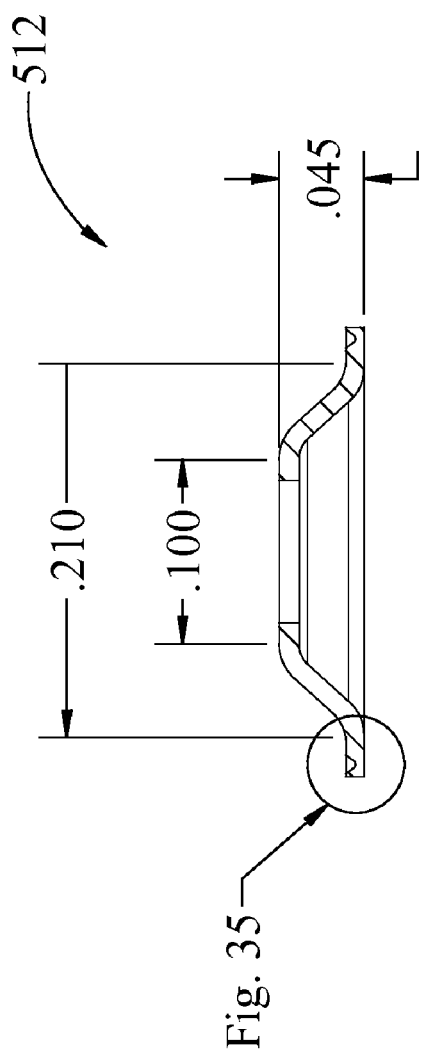
FIG. 34 is a cross-sectional view of the washer shown in FIG. 31 with exemplary dimensions provided for purposes of illustration only according to exemplary embodiments.

FIGS. 29 and 30 illustrate exemplary dimensions in inches that may be used for the contact 500 shown in FIGS. 19 through 25 for purposes of illustration only and not for purposes of limitation. In the particular embodiment shown in FIGS. 29 and 30, the contact 500 may comprise a resilient inner core formed from relatively soft silicone having an effective amount of flame retardant (e.g., halogen and/or halogen-free flame retardants, etc.) to provide the silicone with a flame rating of V0 determined using the Underwriters Laboratories Standard. No. 94. Alternatively, other embodiments may include a resilient inner core formed from silicon or non-silicon materials having a flame rating different than V0 (e.g., V1, V2, HB, HF-1, etc.). Still other embodiments may include a resilient inner core formed from silicon or non-silicon materials that do not have any flame retardants.

With continued reference to FIGS. 29 and 30, the contact 500 may also have an outer electrically-conductive layer formed by electrocoating silver and/or copper filled polyurethane onto the silicone to a layer thickness of about 0.015 inches. The materials and dimensions provided herein are for purposes of illustration only as a contact may be configured from different materials (e.g., materials having different flame ratings, etc.) and/or with different dimensions depending, for example, on the particular PCB layout, space considerations, etc.

FIGS. 31 through 35 illustrate an exemplary embodiment of a washer that may be used as the base member or support layer 512 for the contact 500 shown in FIGS. 19 through 25. FIGS. 32 through 35 provide exemplary dimensions in inches that may be used for the washer 512 for purposes of illustration only and not for purposes of limitation. In the particular embodiment illustrated in FIGS. 32 through 35, the washer 512 may have the dimensions shown therein but with a tolerance of +/−0.010 inch for those dimensions shown to three decimal places. In this particular embodiment, the washer 512 may be formed from cold rolled steel ½ hard with a thickness of about 0.010 inches and which is tin-plated with a plating thickness from about 0.000050 inches to about 0.000100 inches. Alternative materials and dimensions may also be used. For example, the washer 512 (or other suitable base member) may be made thicker or thinner and/or with a smaller or larger diameter depending on the particular size of gap into which the contact will be positioned. Also, the washer 512 does not need to be circular, but may be any suitable shape (e.g., rectangular, oval, trapezoidal, parallelogram, etc.) depending upon the application.

The various contact embodiments disclosed herein may allow a significant reduction in the number of pem-type standoffs needed for a PCB. For example, some PCBs designs use twelve standoffs per board—only four of which are really needed for structure support. Accordingly, significant cost savings may be realized by using one or more contacts disclosed herein instead of standoffs. In such embodiments, it may still be necessary to use some standoffs for providing structural stability for the PCB depending, for example, on the particular application.

In addition, contacts disclosed herein may also be laid out on a PCB with fewer trace reroutes being required. Contacts disclosed herein may further allow for relatively high volume production at relatively low cost.

Contacts (e.g., 100, 200, 300, 400, 500, etc.) of the present disclosure may be compatible with surface mount technology. This, in turn, should allow for relatively low cost installation to PCBs or other substrates using existing pick-and-place equipment, such as grippers, pneumatic heads, vacuum pick-and-place heads, suction cup pick-and-place heads, etc. Some of the contacts disclosed herein are uniquely adapted to be installed utilizing conventional tape-and-reel SMT compatible systems. In such systems, an SMT machine's vacuum (or gripper) head picks and places a contact directly onto a ground location, such as a location on a ground trace of a PCB, which may have been previously screened with solder-paste. At an appropriate manufacturing step, the solder is reflowed to bond the contact to the PCB ground trace. Therefore, at least some embodiments of the present disclosure may be installed without the need for specialized or customized installation equipment.

Certain terminology is used herein for purposes of reference only, and thus is not intended to be limiting. For example, terms such as "upper", "lower", "above", and "below" refer to directions in the drawings to which reference is made. Terms such as "front", "back", "rear", "bottom" and "side", describe the orientation of portions of the component within a consistent but arbitrary frame of reference which is made clear by reference to the text and the associated drawings describing the component under discussion. Such terminology may include the words specifically mentioned above, derivatives thereof, and words of similar import. Similarly, the terms "first", "second" and other such numerical terms referring to structures do not imply a sequence or order unless clearly indicated by the context.

When introducing elements or features and the exemplary embodiments, the articles "a", "an", "the" and "said" are intended to mean that there are one or more of such elements or features. The terms "comprising", "including" and "having" are intended to be inclusive and mean that there may be additional elements or features other than those specifically noted. It is further to be understood that the method steps, processes, and operations described herein are not to be construed as necessarily requiring their performance in the particular order discussed or illustrated, unless specifically identified as an order of performance. It is also to be understood that additional or alternative steps may be employed.

The description of the disclosure is merely exemplary in nature and, thus, variations that do not depart from the gist of the disclosure are intended to be within the scope of the disclosure. Such variations are not to be regarded as a departure from the spirit and scope of the disclosure.

What is claimed is:

1. A contact for establishing electrical grounding contact from at least one electrically-conductive surface to another electrically-conductive surface, the contact comprising:
   a resilient, compressible dielectric core member; and
   at least one outer electrically-conductive layer electrocoated onto the resilient dielectric core member.

2. The contact of claim 1, further comprising a solderable electrically-conductive base member in electrical contact with the outer electrically-conductive layer.

3. The contact of claim 1, further comprising a solderable electrically-conductive base member insert molded to the resilient dielectric core member.

4. The contact of claim 1, wherein an upper portion of the contact has a generally ogival shape.

5. The contact of claim 1, wherein the contact includes an upper portion having slots that define finger elements therebetween, and wherein the finger elements are configured to flex inwardly toward one another and downwardly toward the base member, when a load is applied with a generally downward force component against the finger elements.

6. The contact of claim 1, wherein the contact is configured to be compressed generally between first and second surfaces with sufficient contact pressure effective for establishing an electrically-conductive pathway between the first and second surfaces.

7. The contact of claim 1, wherein the contact is configured to conform at least partially to a gap defined between first and second surfaces, when the contact is sandwiched under pressure between the first and second surfaces with the first surface compressively engaging the contact's upper portion in a direction generally towards the second surface.

8. The contact of claim 1, wherein:
   the resilient dielectric core member comprises at least one of silicone rubber and neoprene foam; and/or
   the electrically-conductive outer layer comprises polyurethane loaded with electrically-conductive particles; and/or
   the contact is formed from materials having the ability to withstand solder reflow temperatures up to about four hundred fifty degrees Fahrenheit; and/or
   the contact is configured to be compatible with surface mount technology.

* * * * *